(12) United States Patent
DePaula

(10) Patent No.: US 8,047,443 B2
(45) Date of Patent: Nov. 1, 2011

(54) DATA STORAGE DEVICES

(75) Inventor: Andrew C. DePaula, Spokane, WA (US)

(73) Assignee: Ocelot, LLC, Spokane, WA (US)

( * ) Notice: Subject to any disclaimer, the term of this patent is extended or adjusted under 35 U.S.C. 154(b) by 201 days.

(21) Appl. No.: 12/604,300

(22) Filed: Oct. 22, 2009

(65) Prior Publication Data
US 2010/0102133 A1      Apr. 29, 2010

Related U.S. Application Data

(60) Provisional application No. 61/107,969, filed on Oct. 23, 2008.

(51) Int. Cl.
*G06K 19/06* (2006.01)
(52) U.S. Cl. .................. 235/492; 235/380; 235/487
(58) Field of Classification Search .................. 235/492, 235/487, 380
See application file for complete search history.

(56) References Cited

U.S. PATENT DOCUMENTS

| | | | |
|---|---|---|---|
| 4,780,603 A | 10/1988 | Hamada | |
| 4,849,617 A * | 7/1989 | Ueda | 235/492 |
| 5,004,899 A * | 4/1991 | Ueda | 235/492 |
| 5,710,421 A * | 1/1998 | Kokubu | 235/492 |
| 5,888,624 A | 3/1999 | Haghiri et al. | |
| 6,547,151 B1 | 4/2003 | Baldi | |
| 6,567,273 B1 | 5/2003 | Liu et al. | |
| 6,665,201 B1 | 12/2003 | Spencer et al. | |
| D487,458 S | 3/2004 | Gentil et al. | |
| D490,814 S | 6/2004 | Kim | |
| 6,744,634 B2 | 6/2004 | Yen | |
| 6,783,060 B2 | 8/2004 | Marappan | |
| 6,824,066 B2 | 11/2004 | Weyant | |
| 6,900,988 B2 | 5/2005 | Yen | |
| D545,311 S | 6/2007 | Wai | |
| 7,269,004 B1 | 9/2007 | Ni et al. | |
| 7,334,725 B2 | 2/2008 | Dan | |
| 7,344,072 B2 * | 3/2008 | Gonzalez et al. | 235/441 |

(Continued)

FOREIGN PATENT DOCUMENTS

WO     WO 2005/124932 A2    12/2005

(Continued)

OTHER PUBLICATIONS

Sony Press Release; "TOPPAN and Sony Successfully Develop 25GB Paper Disc"; Apr. 15, 2004; www.sony.net/SonyInfo/News/Press_Archive/2004/04-15E/; 2pp.

(Continued)

*Primary Examiner* — Michael G Lee
*Assistant Examiner* — Kristy A Haupt
(74) *Attorney, Agent, or Firm* — Wells St. John, P.S.

(57) ABSTRACT

Data storage devices include storage circuitry configured to store data; a first substantially planar card portion comprising the storage circuitry; an electrical interface electrically connected to the storage circuitry and located on one side of the first card portion; and one or more additional substantially planar card portions positioned below the other side of the first card portion and positioned parallel to one another and parallel to the first card portion. The combined thickness of the first card portion and the one or more additional card portions is sufficient to make contact with both an electrical interface of an electrical communications receptacle and a shell portion of the receptacle when the first card portion and the one or more additional card portions are inserted into the communications receptacle.

20 Claims, 23 Drawing Sheets

U.S. PATENT DOCUMENTS

| | | | |
|---|---|---|---|
| 7,377,448 B2 * | 5/2008 | Dan et al. | 235/492 |
| 7,392,358 B2 | 6/2008 | Chen et al. | |
| 7,434,739 B2 * | 10/2008 | Matsuura et al. | 235/492 |
| 2004/0089724 A1 * | 5/2004 | Lasch et al. | 235/487 |
| 2005/0077164 A1 | 4/2005 | Dhers | |
| 2006/0180674 A1 * | 8/2006 | Margalit et al. | 235/492 |
| 2006/0288169 A1 | 12/2006 | Steiner | |
| 2007/0252010 A1 | 11/2007 | Gonzalez et al. | |
| 2008/0087731 A1 * | 4/2008 | Gonzalez et al. | 235/441 |
| 2008/0109309 A1 | 5/2008 | Landau et al. | |
| 2008/0299788 A1 * | 12/2008 | Balchaytis | 439/59 |

FOREIGN PATENT DOCUMENTS

| | | |
|---|---|---|
| WO | PCT/US2009/061725 | 6/2010 |
| WO | PCT/US2009/061725 | 4/2011 |

OTHER PUBLICATIONS

Website—www.minicdwizard; 2000; 1 p.

"Unversal Serial Bus Specification Revision 2.0"; Figure 6.9; pp. 99; Feb. 1998.

* cited by examiner

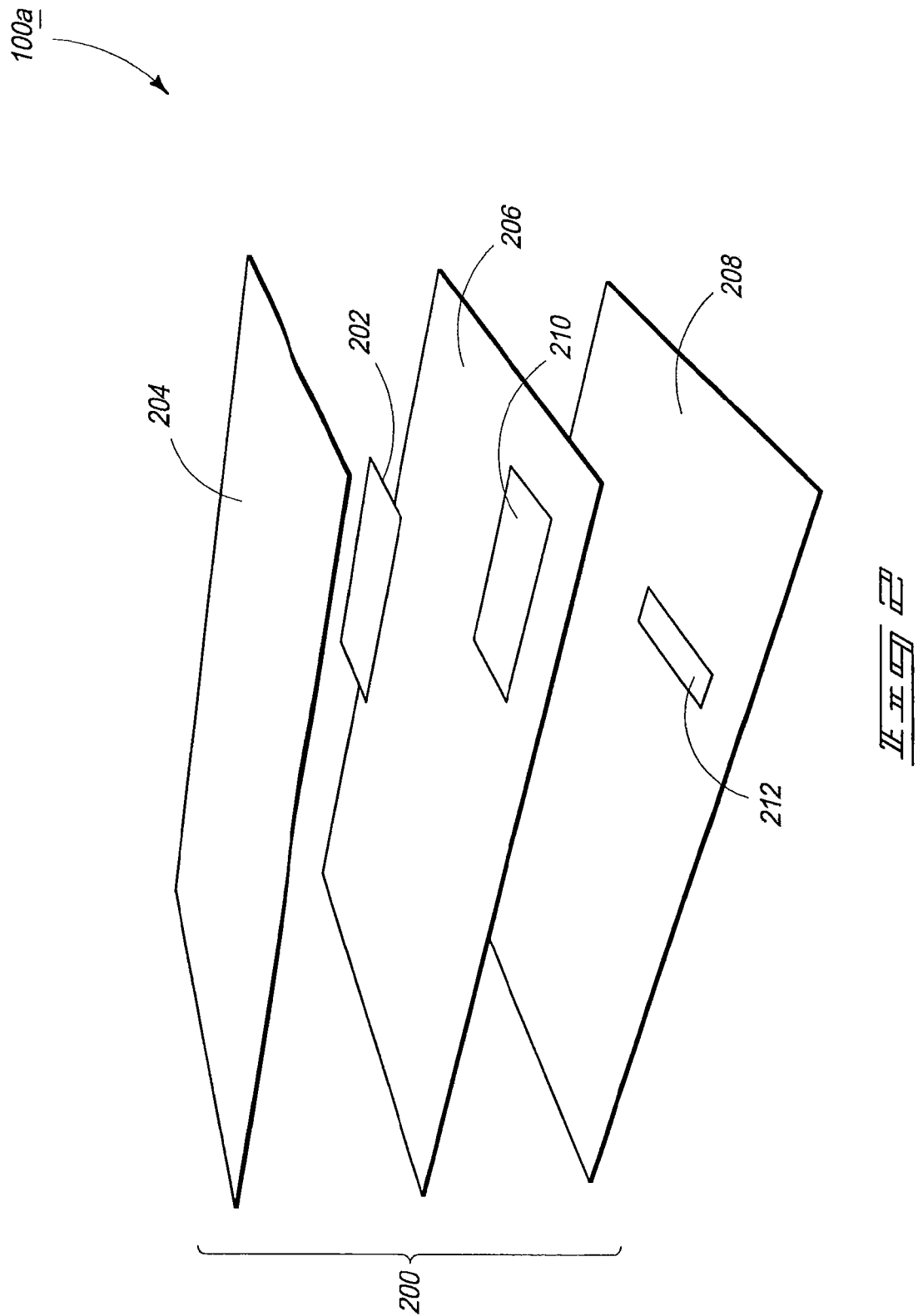

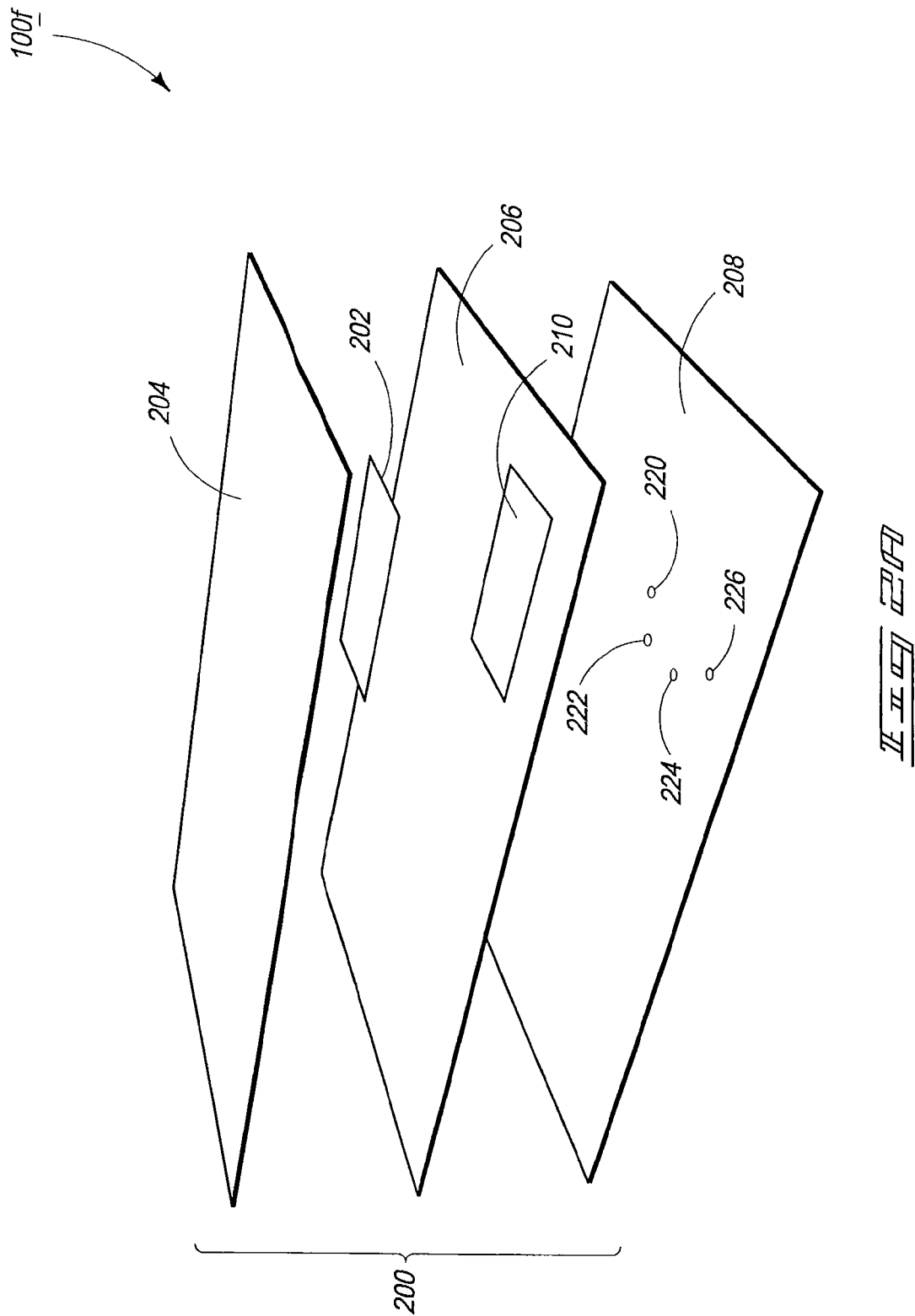

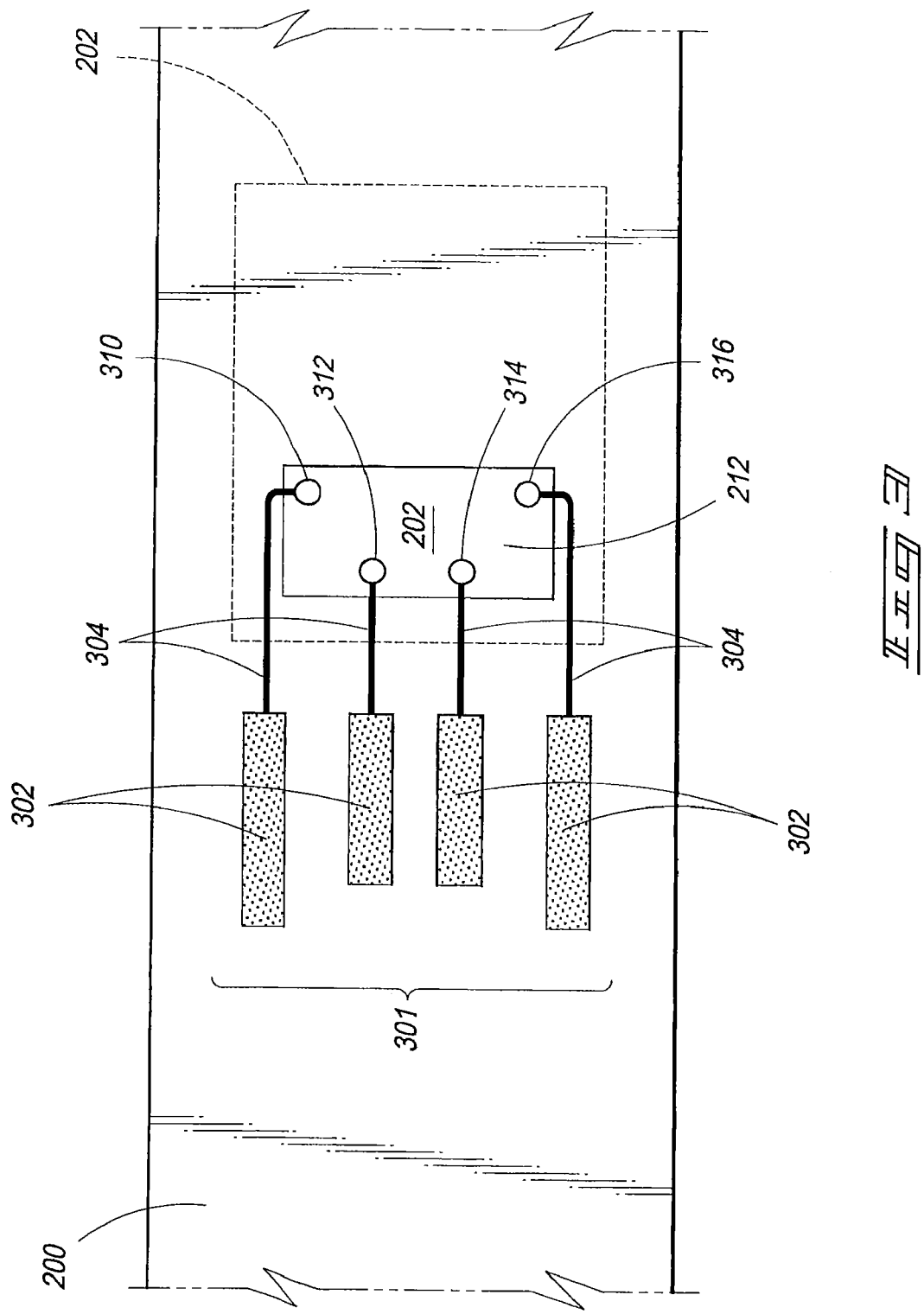

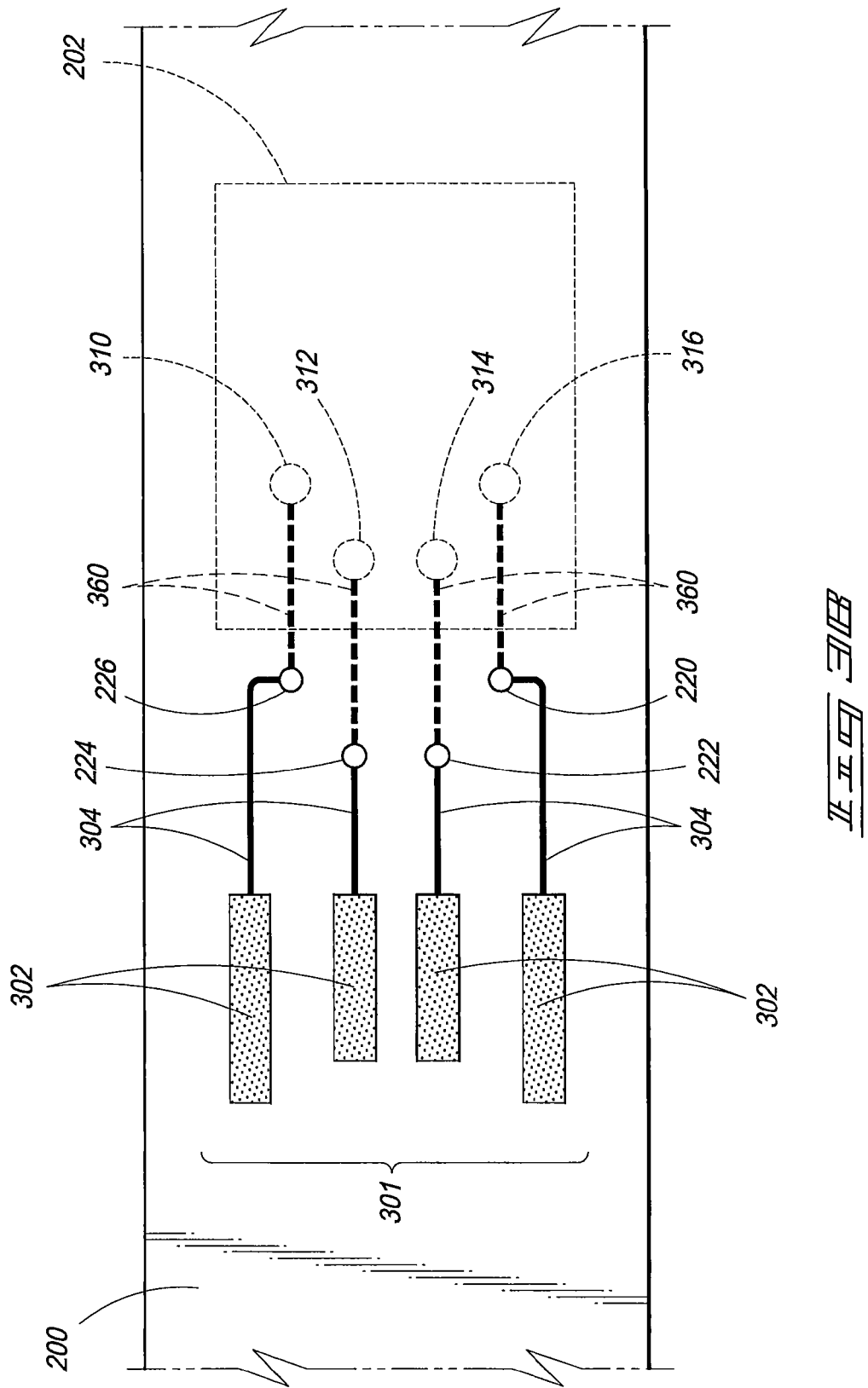

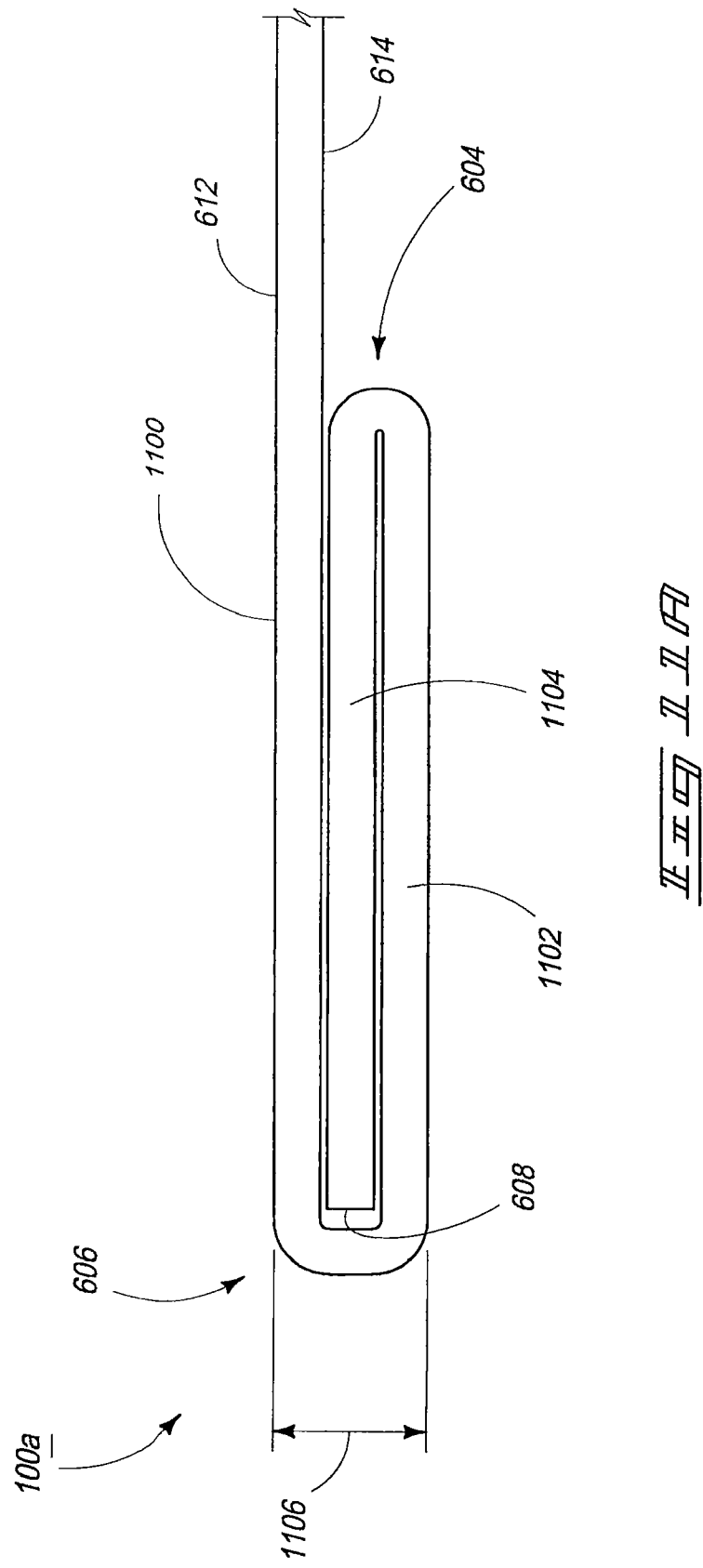

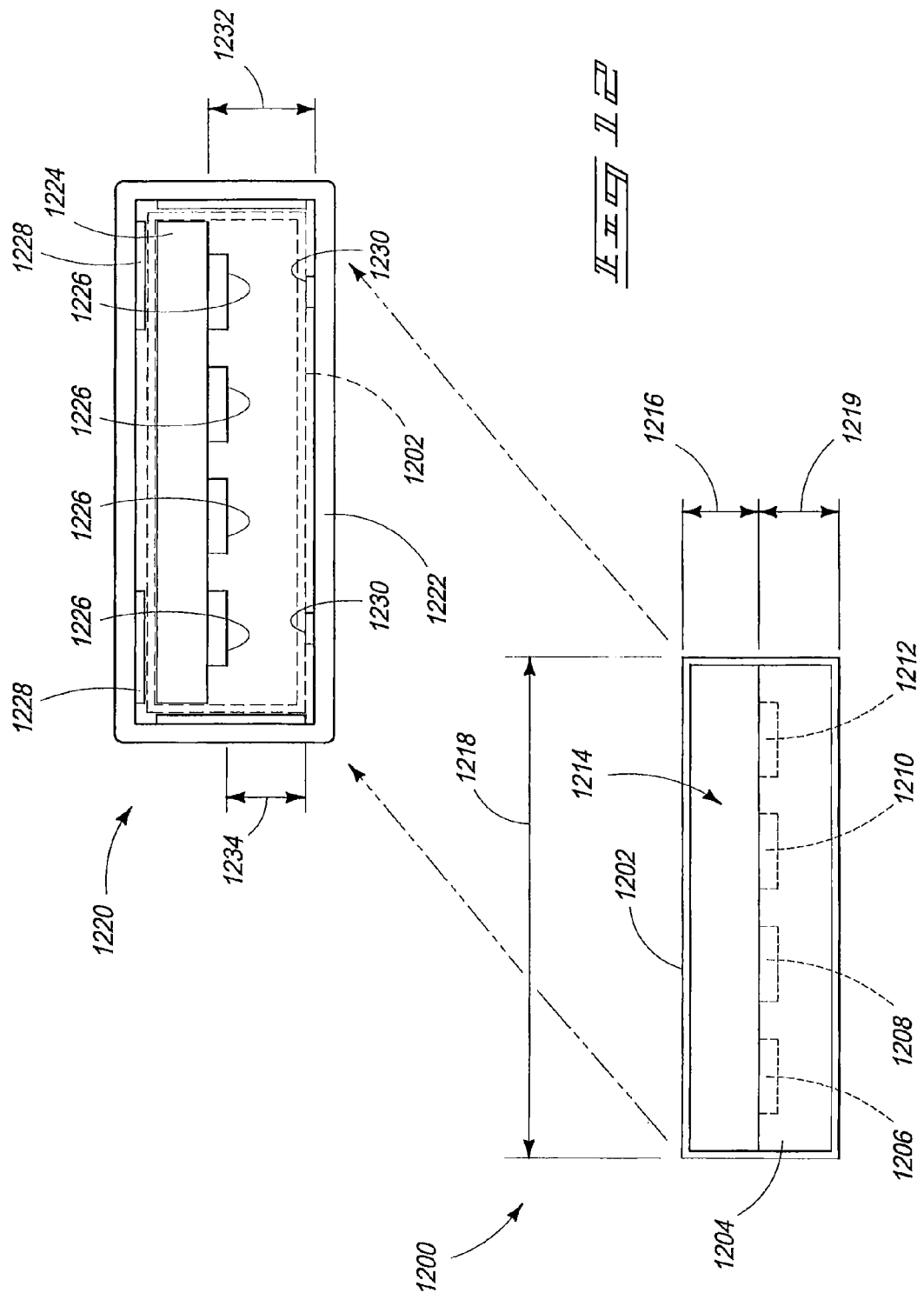

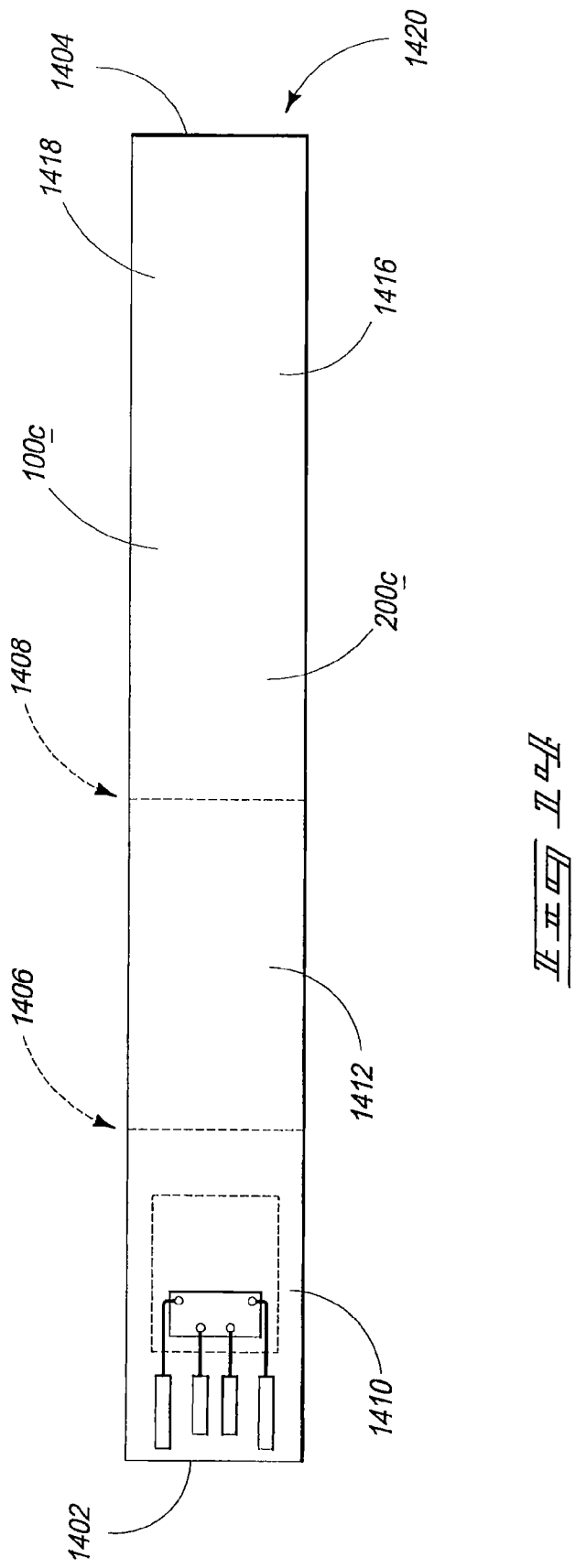

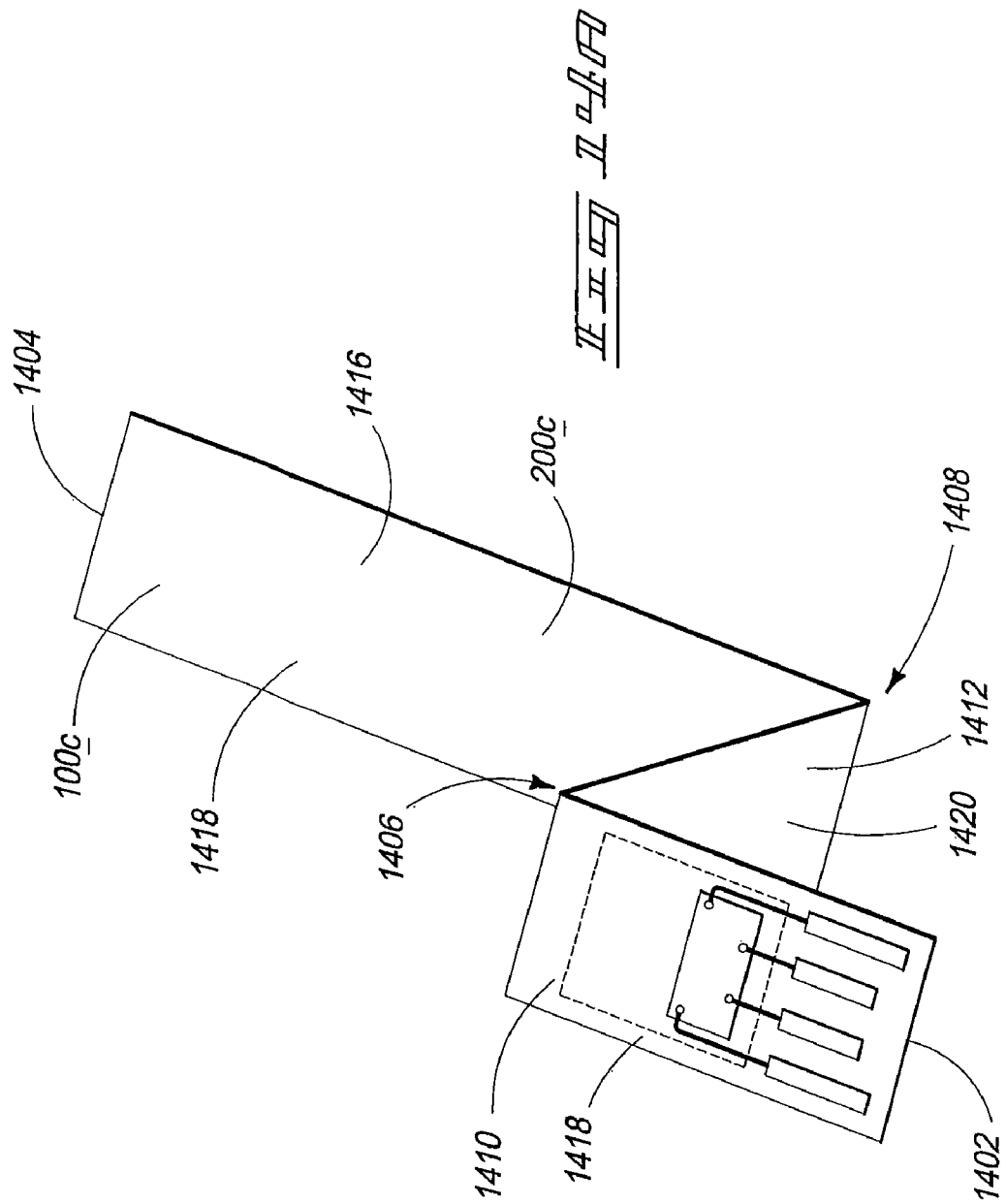

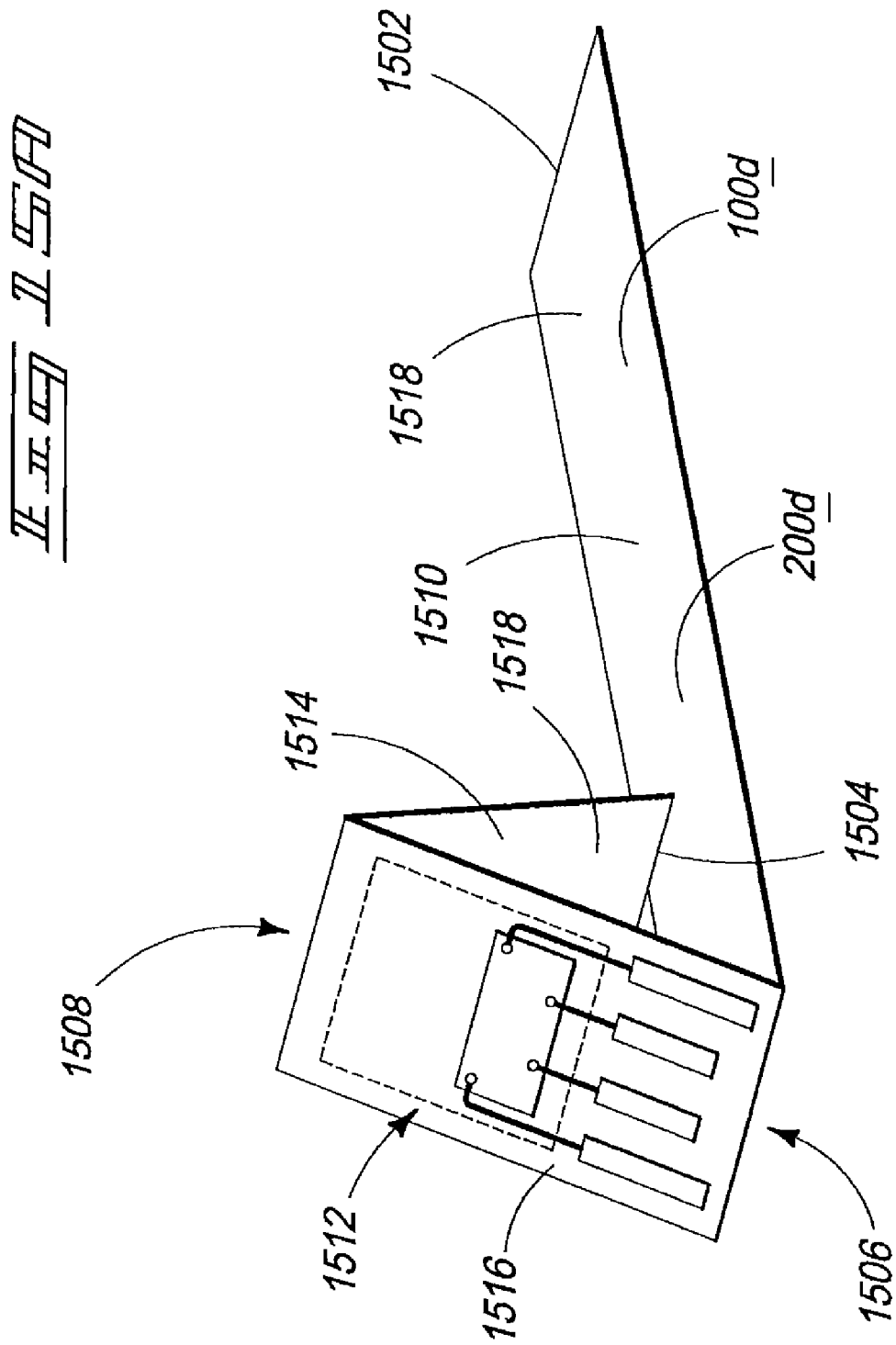

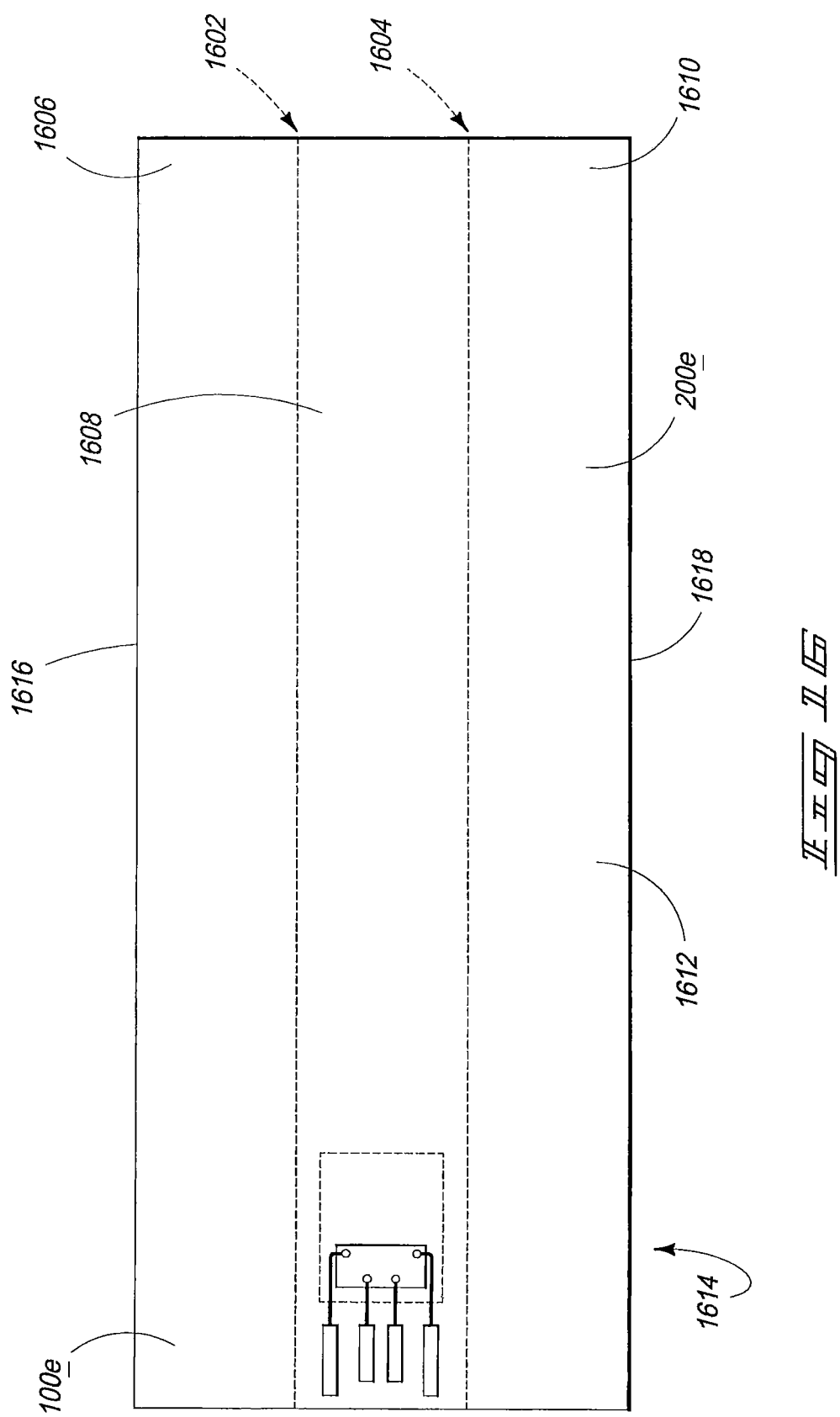

DATA STORAGE DEVICES

RELATED PATENT DATA

This application claims the benefit of U.S. Provisional Patent Application Ser. No. 61/107,969, which was filed Oct. 23, 2008, and which is incorporated by reference herein.

TECHNICAL FIELD

The present invention, in various embodiments, relates to data storage devices.

BACKGROUND OF THE INVENTION

Situations often arise in which it may be desirable to inexpensively distribute electronic data stored by a tangible object with the hope that the data stored by the tangible object will be uploaded to a computer, which may then present the data to a user. For example, when publishing an advertisement for an automobile in a magazine, it may be desirable to distribute a CD containing a electronic brochure for the automobile or a video featuring the automobile.

Unfortunately, known tangible objects used to distribute electronic data have limitations. CDs, for example, are expensive, bulky, and somewhat fragile. Conventional USB thumb drives are widely used to share data. However, these devices are expensive and have a bulky, three dimensional shape that makes them awkward to enclose with print media such as magazines.

BRIEF DESCRIPTION OF THE DRAWINGS

Preferred embodiments of the invention are described below with reference to the following accompanying drawings.

FIG. 2 is an exploded view of a data storage device according to an embodiment.

FIG. 2A is an exploded view of a data storage device according to an embodiment.

FIG. 3 is a bottom view of a data storage device according to an embodiment.

FIG. 3B is a bottom view of a data storage device according to an embodiment.

FIG. 11A is a side view of a folded data storage device according to an embodiment.

FIG. 12 illustrates an end view of a standard electronic communications receptacle and an end view of a standard electronic communications plug according to an embodiment.

FIG. 13 is a perspective view of one embodiment of a data storage device in another partially folded state according to an embodiment.

FIG. 14 is a top view of another embodiment of a data storage device.

FIG. 14A is a perspective view of another embodiment of a data storage device in a partially folded state according to an embodiment.

FIG. 15A is a perspective view of another embodiment of a data storage device in a partially folded state according to an embodiment.

FIG. 16 is a top view of another embodiment of a data storage device.

DETAILED DESCRIPTION OF THE PREFERRED EMBODIMENTS

Data storage devices are described herein. In one embodiment, a data storage device includes a card formed of laminated layers of paper. The card houses storage circuitry configured to store data. The card may include a USB electrical interface. Initially, the card may be substantially planar. A user may fold portions of the card so that the folded card has a desired thickness. The folded card may be inserted into a USB receptacle, which may then read data from the storage circuitry or write data to the storage circuitry via the card's USB electrical interface. The card may be attached to a carrier such as a business card or advertising piece.

Figure 1:
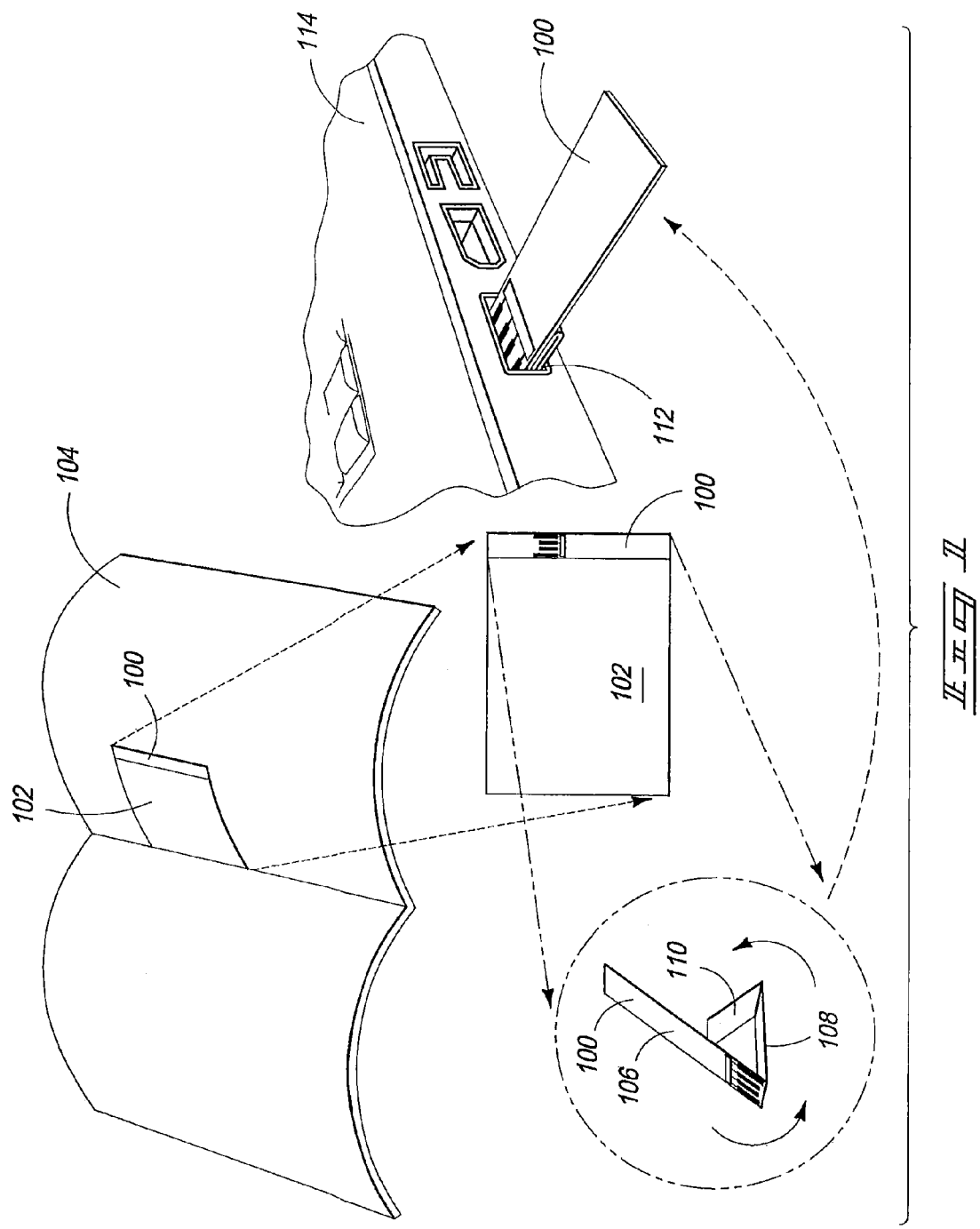
FIG. 1 illustrates a method of using a data storage device according to an embodiment.

Referring to FIG. 1, a magazine 104 is illustrated. A carrier 102 is bound within magazine 104. The carrier may be a sheet of printed paper, such as an advertisement. A data storage device 100 may be attached to carrier 102. The data storage device may, in one embodiment, store data related to printing applied to the carrier. For example, the carrier may be a print advertisement for an automobile and the data stored by the data storage device may be a brochure for the automobile or a video featuring the automobile. Carrier 102 and/or data storage device 100 may be substantially planar so as to fit between the pages of magazine 104.

Upon encountering carrier 102, a person reading magazine 104 may detach data storage device 100 from carrier 102. The reader may then fold data storage device 100 as illustrated in FIG. 1 so that a first portion 106 is folded with respect to a second portion 108 and a third portion 110 is folded with respect to second portion 108. As a result of the folding, first portion 106 may be in contact with third portion 110 and third portion 110 may be in contact with second portion 108 such that first portion 106, second portion 108, and third portion 110 are parallel to each other. In one embodiment, instructions for folding data storage device 100 may be printed on data storage device 100 and/or on carrier 102.

In this folded position, the person may then insert folded data storage device 100 into an electronic communications receptacle 112 of a computer 114 and use computer 114 to access the data stored by data storage device 100. In some embodiments, computer 114 may also cause data to be stored in data storage device 100 that was not present in data storage device 100 when data storage device 100 was attached to carrier 102. In one embodiment, electronic communications receptacle 112 may be a USB receptacle, such as a USB Series A receptacle.

Various embodiments of carrier 102 and data storage device 100 are possible. For example, carrier 102 may be a business card and data storage device 100 may store a product catalog, resume, portfolio, and/or sales literature. Alternatively, carrier 102 may be a postcard and data storage device 100 may store digital pictures. Alternatively, carrier 102 may be an event ticket such as a movie or concert ticket and data storage device 100 may store video or audio such as a movie trailer or music. Alternatively, carrier 102 may be a greeting card and data storage device 100 may store pictures or audio. Alternatively, carrier 102 may be bound in a book and data storage device 100 may store content related to the book, such as an additional chapter or a preview chapter of a sequel to the book. Other embodiments are also possible.

As was mentioned above, data storage device 100 may be attached to carrier 102 via a fastener such as an adhesive or one or more perforations. In the case of a perforation, carrier 102 and data storage device 100 may both be formed from a single sheet of laminated card stock and data storage device 100 may be delimited from carrier 102 via one or more perforated lines.

The fastener may allow data storage device 100 to be easily removed from carrier 102 without damaging data storage device 100. For example, if the fastener is an adhesive, data storage device 100 may be peeled apart from carrier 102 without ripping, tearing, or otherwise damaging data storage device 100. Similarly, if the fastener is one or more perforation lines, data storage device 100 may be carefully separated from carrier 102 by tearing along the perforation lines.

Although data storage device 100 is illustrated as being located along an edge of carrier 102 in FIG. 1, in other embodiments, data storage device 100 may be attached substantially anywhere on carrier 102.

Referring to FIG. 2, an exploded view of one embodiment 100a of data storage device 100 is illustrated. In the illustrated embodiment, data storage device 100a includes a first layer 204, a second layer 206, and a third layer 208. These three layers are laminated together to form a card 200. The three layers may be made from a paper containing material (e.g., paper, card stock, etc.), flexible plastic, or other material that can be easily folded. The three layers need not all have the same thickness, but they may have the same thickness. The three layers need not all be made from the same material, but they may be made from the same material.

In one embodiment, the laminated card 200 may have substantially the same thickness as common card stock. For example, laminated card 200 may have substantially the same thickness as a standard business card.

First layer 204 and third layer 208 may be made of a material that readily bonds with ink so that printing may be applied to these layers, for example using an ink-jet, laser, or offset printer. Printing may be applied to first layer 204 and third layer 208 before and/or after first layer 204, second layer 206, and third layer 208 are laminated together.

Data storage device 100a also includes storage circuitry 202. In one embodiment, storage circuitry 202 may be a semiconductor chip comprising circuitry for storing and accessing data. For example, storage circuitry 202 may include read/write memory such as flash memory and/or read-only memory. Storage circuitry 202 may include connection points that may be electrically connected to an interface, such as a USB plug. This interface is described in further detail below.

In one embodiment, storage circuitry 202 may be programmed with desired data prior to being laminated within card 200 (e.g., between first layer 204 and third layer 208). If storage circuitry 202 includes read/write memory, the data stored by storage circuitry 202 may be changed after storage circuitry 202 is laminated within card 200.

In one embodiment, storage circuitry 202 may have a capacity substantially similar to a capacity of a conventional USB thumb drive. For example, storage circuitry 202 may have a capacity of up to hundreds of megabytes or up to tens of gigabytes.

In one embodiment, a window 210 may be formed within second layer 206 (e.g., by removing a portion of the material of second layer 206 to form a void in second layer 206). Window 210 may have the same or larger dimensions as storage circuitry 202 so that storage circuitry 202 fits within window 210. When laminating card 200, storage circuitry 202 may be placed within window 210. In one embodiment, second layer 206 may have substantially the same thickness as storage circuitry 202. In this embodiment, upon placing storage circuitry 202 within window 210 and laminating first layer 204, second layer 206, and third layer 208 together to form card 200, card 200 may have a uniform thickness despite the fact that storage circuitry 202 has been laminated within card 200.

In other embodiments, second layer 206 may be slightly thinner than storage circuitry 202 so that card 200 is thicker in regions of card 200 where storage circuitry 202 is present than in regions of card 200 where storage circuitry 202 is not present. In yet other embodiments, window 210 might not be present in second layer 206 and as a result, card 200 may be thicker in regions of card 200 where storage circuitry 202 is present than in regions of card 200 where storage circuitry 202 is not present.

Similarly, in other embodiments, second layer 206 may be slightly thicker than storage circuitry 202 so that card 200 is thinner in areas of card 200 where storage circuitry 202 is present than in areas of card 200 where storage circuitry 202 is not present.

In one embodiment, first layer 204 may be laminated to second layer 206 using adhesive, second layer 206 may be laminated to third layer 208 using adhesive and storage circuitry 202 may be laminated to first layer 204 and/or third layer 208 using adhesive.

In one embodiment, a window 212 may be formed within third layer 208 (e.g., by removing a portion of the material of second layer 208 to form a void in second layer 208). Window 212 may expose a portion of storage circuitry 202 and in particular may expose the connection points of storage circuitry 202 described above.

In one embodiment, a width of card 200 (i.e., the second largest dimension of card 200) may be substantially the same as a of a standard electronic communications plug (e.g., a USB Series A plug).

In one embodiment, carrier 102 may be formed when card 200 is formed. For example, a first layer sheet, second layer sheet, and third layer sheet may be laminated together to form a card sheet. Carrier 102 may be cut from the card sheet and data storage device 100 may be delimited from carrier 102 by perforating the card sheet. In some configurations, a plurality of carriers and data storage devices may be formed from a single card sheet.

For example, twelve business cards (carriers) attached to twelve data storage devices may be formed from a single card sheet by laminating twelve different semiconductor chips each comprising storage circuitry within three layer sheets to form a card sheet, cutting the card sheet to delimit twelve business card/data storage device pairs, and perforating the twelve business cards to delimit the data storage devices from the business cards without detaching the data storage devices from the business cards.

Various methods may be used to form data storage device 100a. In one embodiment a method may include forming first layer 204, second layer 206, and third layer 208, cutting the three layers so that the three layers have desired dimensions, removing a portion of layer 206 to form window 210, removing a portion of layer 208 to form window 212, placing storage circuitry 202 between first layer 204 and third layer 208, locating storage circuitry 202 within window 210, aligning window 212 to expose a portion of storage circuitry 202, laminating first layer 204 to second layer 206, laminating second layer 206 to third layer 208, laminating storage circuitry 202 to first layer 204, laminating storage circuitry 202 to third layer 208, and storing desired data in storage circuitry 202. These method steps may be performed in various orders and need not be performed in the order specified above.

Although the embodiment of card 200 described above is described as having three layers, other embodiments are possible in which fewer than three layers or more than three layers are used to form card 200. For example, in one embodiment, first layer 204 and second layer 206 may be used but third layer 208 may be omitted.

Referring to FIG. 2A, an exploded view of another embodiment 100f of data storage device 100 is illustrated. In the illustrated embodiment, data storage device 100f includes first layer 204, second layer 206, third layer 208, storage circuitry 202, and window 210 as in data storage device 100a of FIG. 2. However, instead of using window 212 to access connection points of storage circuitry 202 as was described above in relation to FIG. 2, a plurality of holes 226, 224, 222, and 220 may be formed in third layer 208. Holes 226, 224, 222, and 220 may be positioned within third layer 208 so as to be directly below connection points of storage circuitry 202 so that when the three layers and storage circuitry 202 are laminated together, the connection points of storage circuitry 202 are exposed through holes 226, 224, 222, and 220.

Referring to FIG. 3, a bottom view of the embodiment of data storage device 100a depicted in FIG. 2 is illustrated. Storage circuitry 202 is shown in phantom since storage circuitry 202 is behind third layer 208. However, a portion of storage circuitry 202 is visible through window 212. Storage circuitry 202 includes connection points 310, 312, 314, and 316. These connection points, in one embodiment, may be conductive pads formed on storage circuitry 202.

Although storage circuitry 202 is shown as occupying a relatively small area, in some embodiments, storage circuitry 202 may be larger than illustrated in FIG. 3 and may extend toward the right side of FIG. 3.

An electrical interface 301 may be formed on card 200. Electrical interface 301 may include one or more electrically conductive regions 302 arranged in a desired configuration. For example, conductive regions 302 depicted in FIG. 3 are arranged to have lengths, widths, and positions that form an electrical interface 301 of a standard USB Series A plug.

Conductors 304 electrically connect conductive regions 302 with connection points 310, 312, 314, and 316 as illustrated in FIG. 3. In one embodiment, conductive regions 302 and conductors 304 may comprise conductive ink printed onto card 200 using, for example, an ink-jet or offset printer loaded with conductive ink. In some embodiments, portions of conductive regions 302 and/or conductors 304 may be printed onto the portion of storage circuitry 202 exposed by window 212.

Figure 3A:
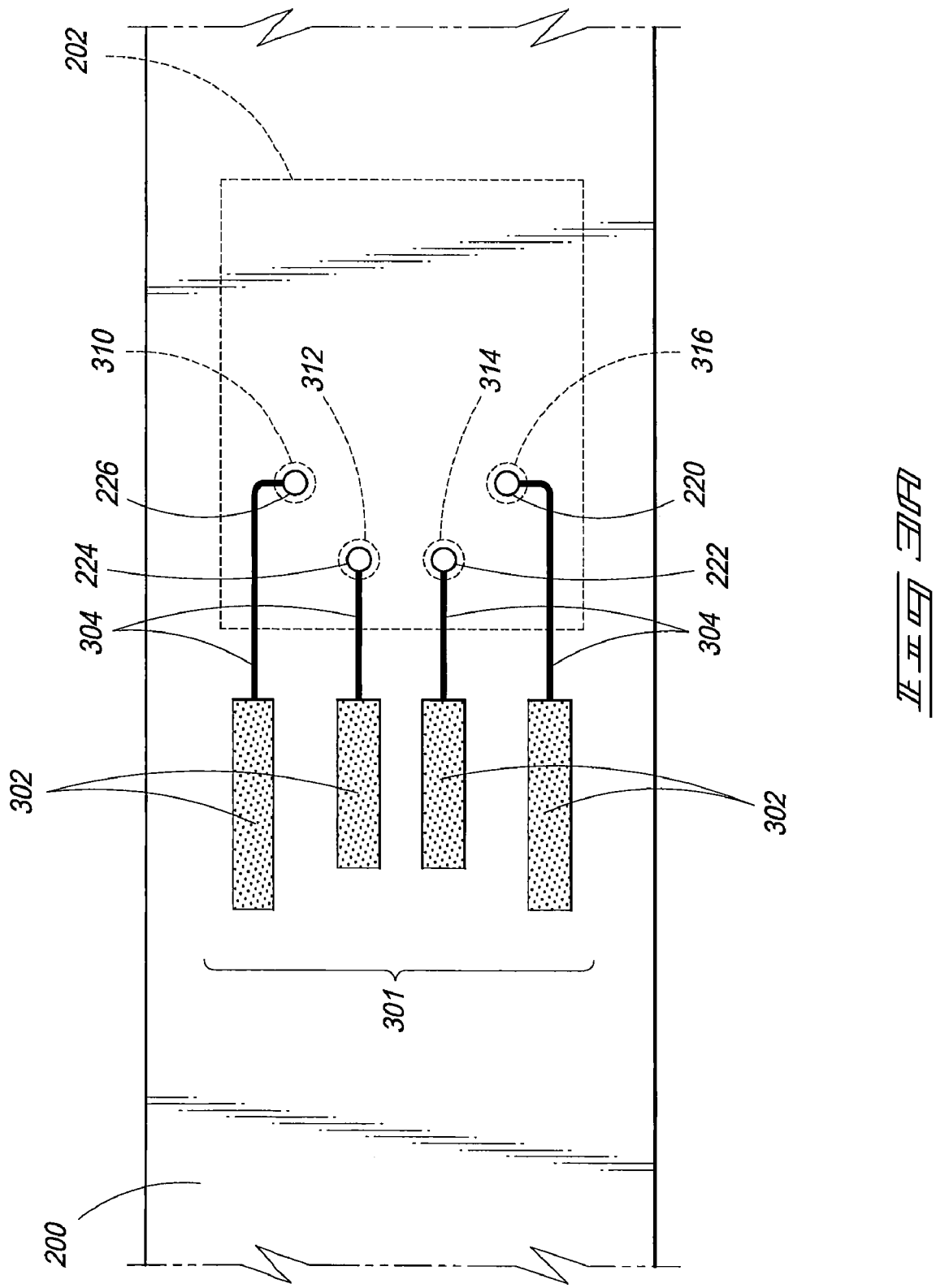
FIG. 3A is a bottom view of a data storage device according to an embodiment.

Referring to FIG. 3A, a bottom view of the embodiment of data storage device 100f depicted in FIG. 2A is illustrated. In this embodiment, vias may be formed by aligning holes 226, 224, 222, and 220 of layer 208 respectively with connection points 310, 312, 314, and 316 prior to laminating data storage device 100f. In some embodiments, a conductive material (e.g., conductive ink) may be printed or deposited surrounding holes 226, 224, 222, and 220 and/or within holes 226, 224, 222, and 220 after data storage device 100f has been laminated to provide robust electrical connections between conductors 304 and connection points 310, 312, 314, and 316.

Referring to FIG. 3B, a bottom view of another embodiment of data storage device 100 is depicted in which storage circuitry 202 is shifted as compared with FIG. 3A and conductors 360 electrically connect vias (described above in relation to FIG. 3A) formed in holes 226, 224, 222, and 220 respectively with connection points 310, 312, 314, and 316. Conductors 360 may comprise conductive ink printed onto an upper surface of layer 208 (the surface opposite that on which electrical interface 301 is located) and may not be visible in FIG. 3B. In this embodiment, storage circuitry 202 is not exposed by holes 226, 224, 222, and 220.

Figure 4:
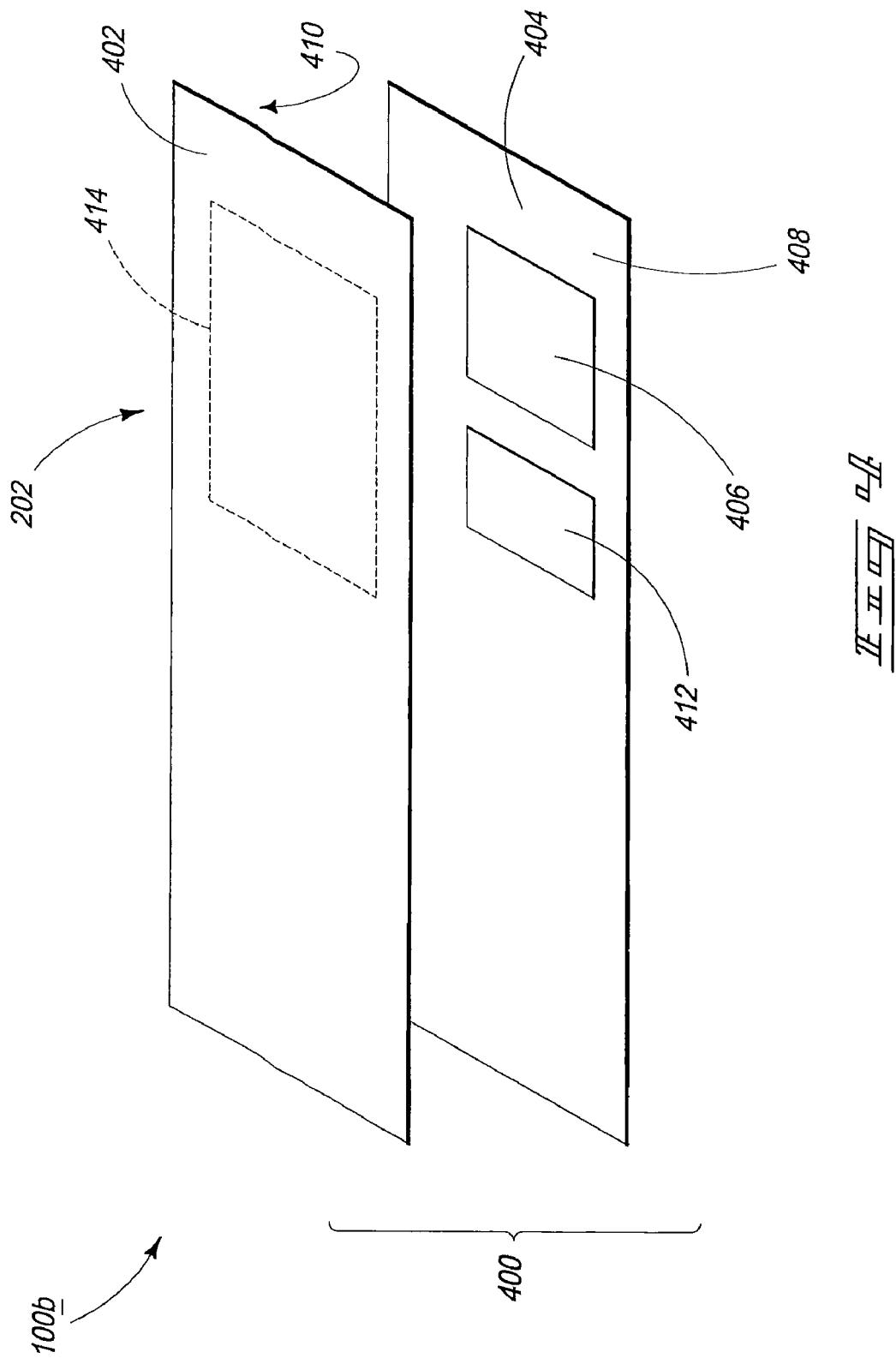
FIG. 4 is an exploded view of another data storage device according to an embodiment.

Referring to FIG. 4, an exploded view of another embodiment 100b of data storage device 100 is illustrated. In the illustrated embodiment, data storage device 100b includes a first layer 402 and a second layer 404. These two layers are laminated together to form a card 400. Like the layers described above in relation to FIG. 2, first layer 402 and second layer 404 may be made from a paper containing material (e.g., paper, card stock, etc.), flexible plastic, or other material that can be easily folded. The two layers of card 400 need not both have the same thickness, but they may have the same thickness. The two layers of card 400 need not be made from the same material, but they may be made from the same material.

In one embodiment, the laminated card 400 may have substantially the same thickness as common card stock. For example, laminated card 400 may have substantially the same thickness as a standard business card.

First layer 402 and second layer 404 may be made of a material that readily bonds with ink so that printing may be applied to these layers, for example using an ink-jet, laser, or offset printer. Printing may be applied to first layer 402 and second layer 404 before and/or after first layer 402 and second layer 404 are laminated together.

Data storage device 100b also includes storage circuitry 202. In this embodiment, storage circuitry 202 may include a first portion 414 comprising electronics printed directly onto a bottom surface 410 of first layer 402 using electrically functional ink forming transistors, capacitors, conductors, etc. First portion 414 is shown in phantom since first portion 414 may be printed on bottom surface 410, which is not visible in FIG. 4. In some embodiments, storage circuitry 202 may also include a second portion 406 comprising electronics printed directly onto a top surface 408 of second layer 404 using electrically functional ink. In some embodiments, storage circuitry 202 may include additional portions printed on additional layers. The portions may be electrically connected together via aligned connection points and/or electrically conductive vias formed in the layers of card 400. The printed electronics embodiment of storage circuitry 202 may provide some or all of the functionality of storage circuitry 202 described herein, such as read/write capability.

First portion 414 may comprise connection points that are exposed via a window 412 formed in second layer 404 (e.g., by removing a portion of the material of second layer 404 to form a void in second layer 404).

In one embodiment, first layer 402 may be laminated to second layer 404 using adhesive. Although the embodiment of card 400 described above is described as having two layers, other embodiments are possible in which fewer than two layers or more than two layers are used to form card 400.

Various methods may be used to form data storage device 100b. In one embodiment a method may include forming first layer 402 and second layer 404, cutting the two layers so that the two layers have desired dimensions, removing a portion of layer 404 to form window 412, printing first portion 414 on first layer 402, printing second portion 406 on second layer 404, aligning first layer 402 with second layer 404 so that electrical connections are made between first portion 414 and second portion 406, laminating first layer 402 to second layer 404, and storing desired data in storage circuitry 202. These method steps may be performed in various orders and need not be performed in the order specified above.

Figure 5:
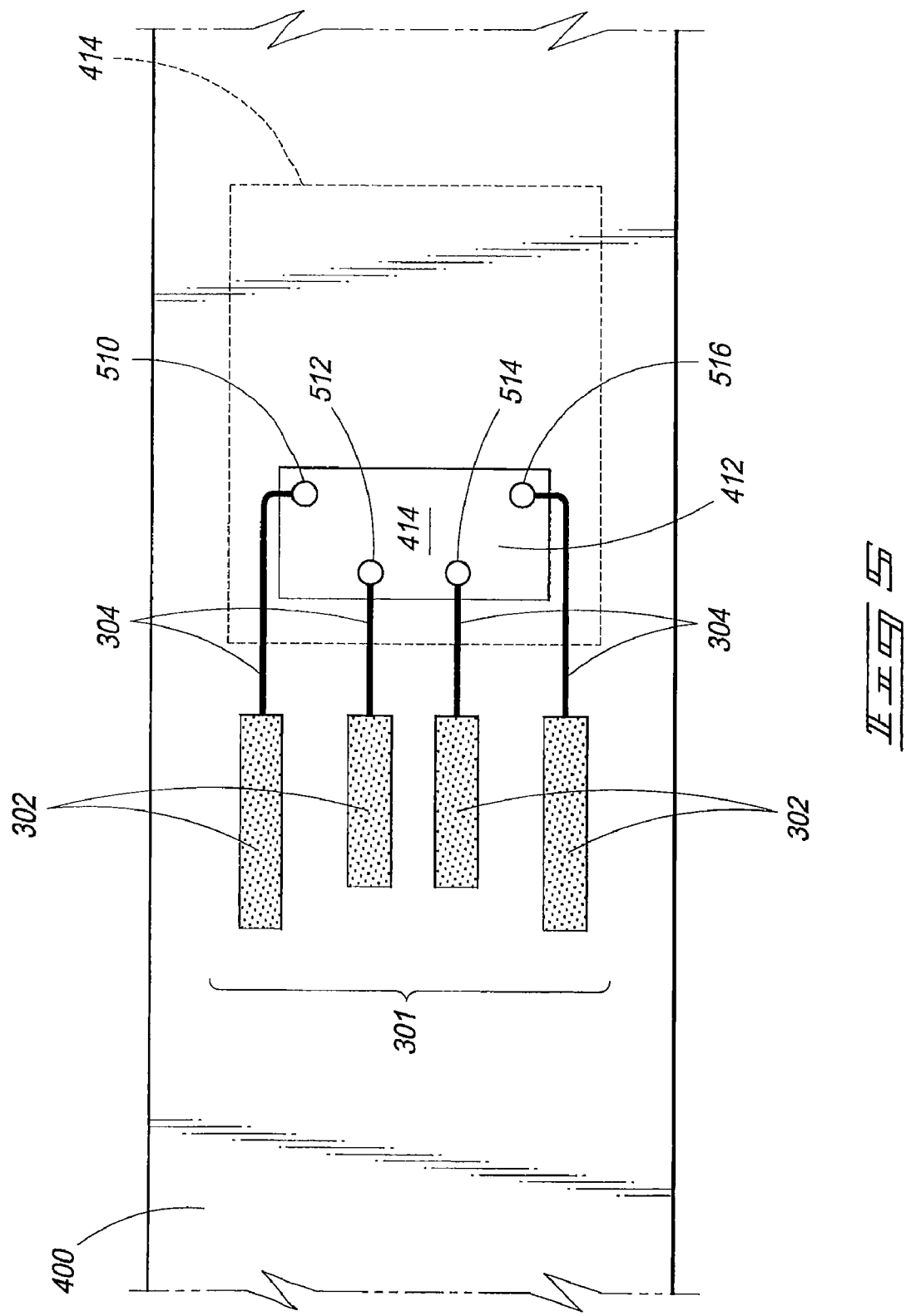
FIG. 5 is a bottom view of another data storage device according to an embodiment.

Referring to FIG. 5, a bottom view of the embodiment of data storage device 100b depicted in FIG. 4 is illustrated. First portion 414 of storage circuitry 202 is shown in phantom since first portion 414 is behind second layer 404. However, a portion of first portion 414 is visible through window 412. First portion 414 includes connection points 510, 512, 514, and 516. These connection points, in one embodiment, may be conductive pads formed as part of first portion 414. Electrical interface 301 (described above in relation to FIG. 3) may be formed on card 400.

The embodiments of data storage devices disclosed herein may use any of the various embodiments of storage circuitry 202 and the various embodiments of electrical connections between storage circuitry 202 and interface 301 described above in relation to FIGS. 2, 2A, 3, 3A, 3B, 4, and 5.

Figure 6:
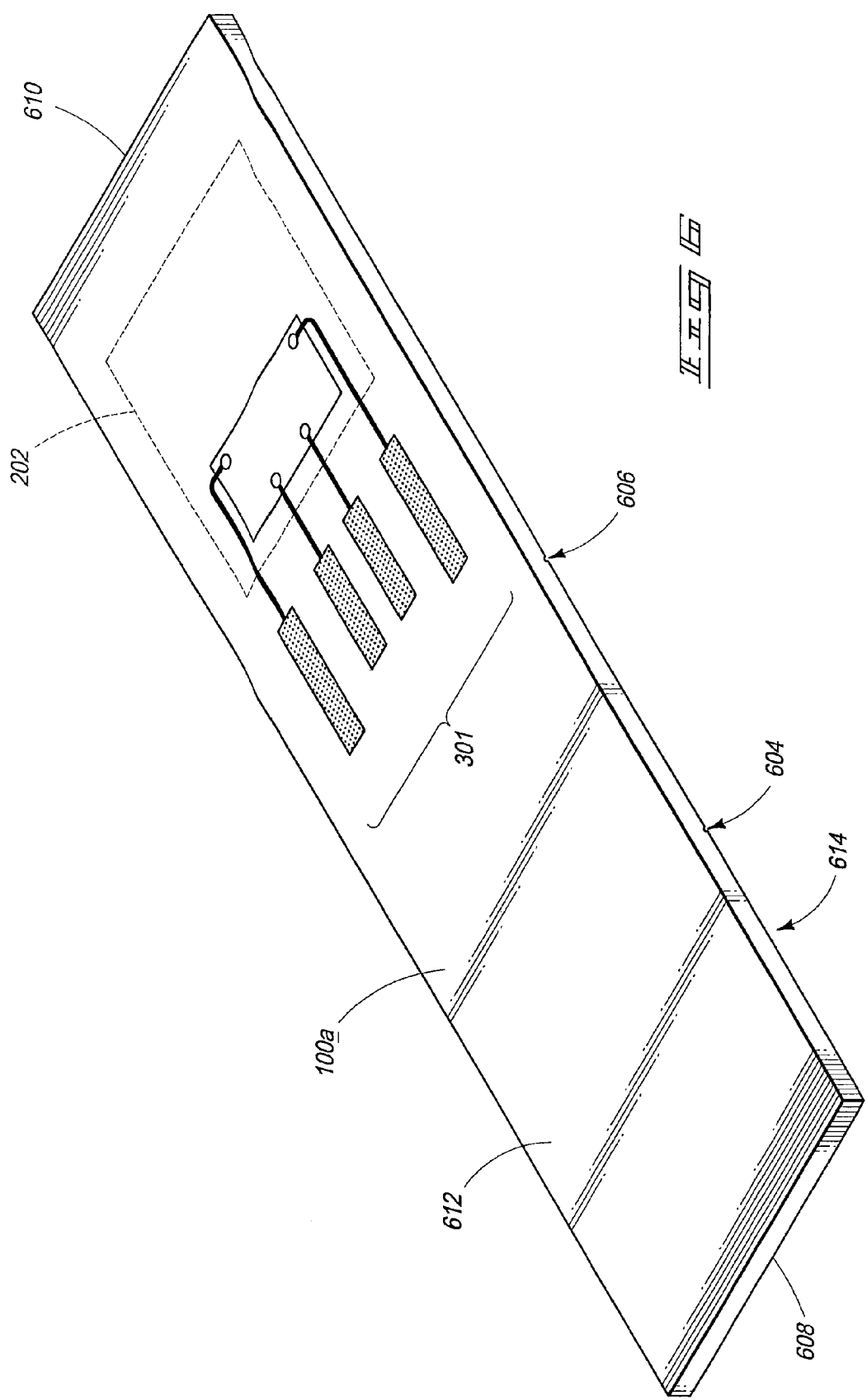
FIG. 6 is a perspective view of a data storage device according to an embodiment.

Referring to FIG. 6, a perspective view of a top surface 612 of data storage device 100a is illustrated. Note that data storage device 100a is substantially planar and comprises a first end 608, a second end 610, an upper surface 612, and a lower surface 614 (not visible in FIG. 6). Data storage device 100a also include two guides 604 and 606. Guide 604 may indicate a location where a first fold of data storage device 100a may be made and guide 606 may indicate a location where a second fold of data storage device 100a may be made.

Figure 7:
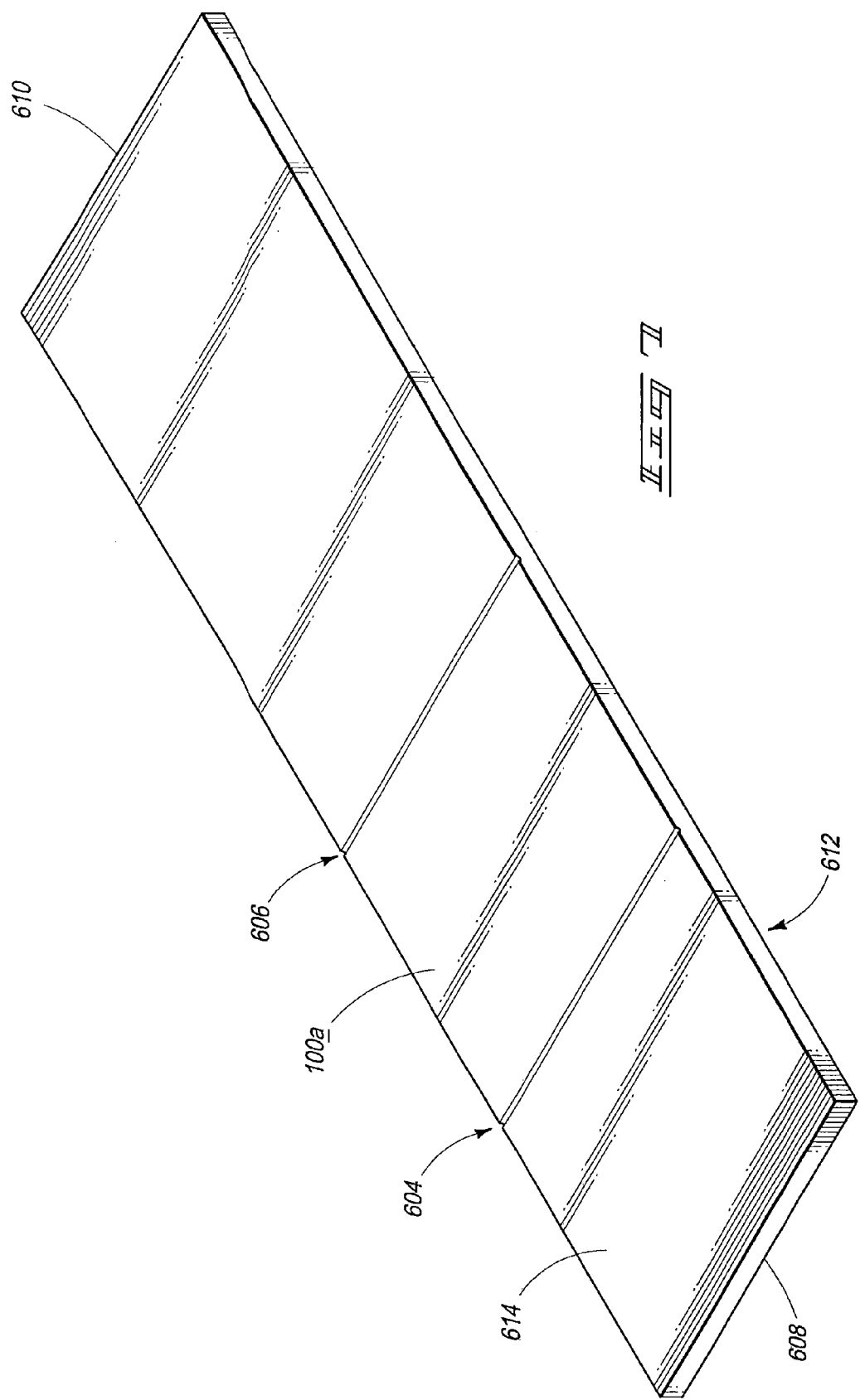
FIG. 7 is another perspective view of a data storage device according to an embodiment.

Although guides 604 and 606 are depicted as grooves in FIG. 7, a guide may be embodied in one or more of many different forms. For example the guide may be a printed line, a groove, a perforation, a crease, or some other device that indicates where a fold is to be made. In addition to indicating where the fold is to be made, the guide may help facilitate the fold and/or ensure that the fold is straight. For example, if the guide is a perforation, when data storage device 100a is folded, the perforation may force the fold to be straight across the width of data storage device 100a at a desired location.

In one embodiment, a guide may be placed along a second longest dimension of data storage device 100 (e.g., along a width of data storage device 100a) as illustrated by guides 604 and 606 in FIGS. 6 and 7. Alternatively or additionally, a guide may be placed along a longest dimension of data storage device 100 (e.g., along a length of data storage device 100e) as illustrated by guides 1602 and 1604 in FIG. 16.

Referring to FIG. 7, a perspective view of a bottom surface 614 of data storage device 100a is illustrated. As depicted in FIG. 7, guides 604 and 606 extend across a width of data storage device 100a.

Figure 8:
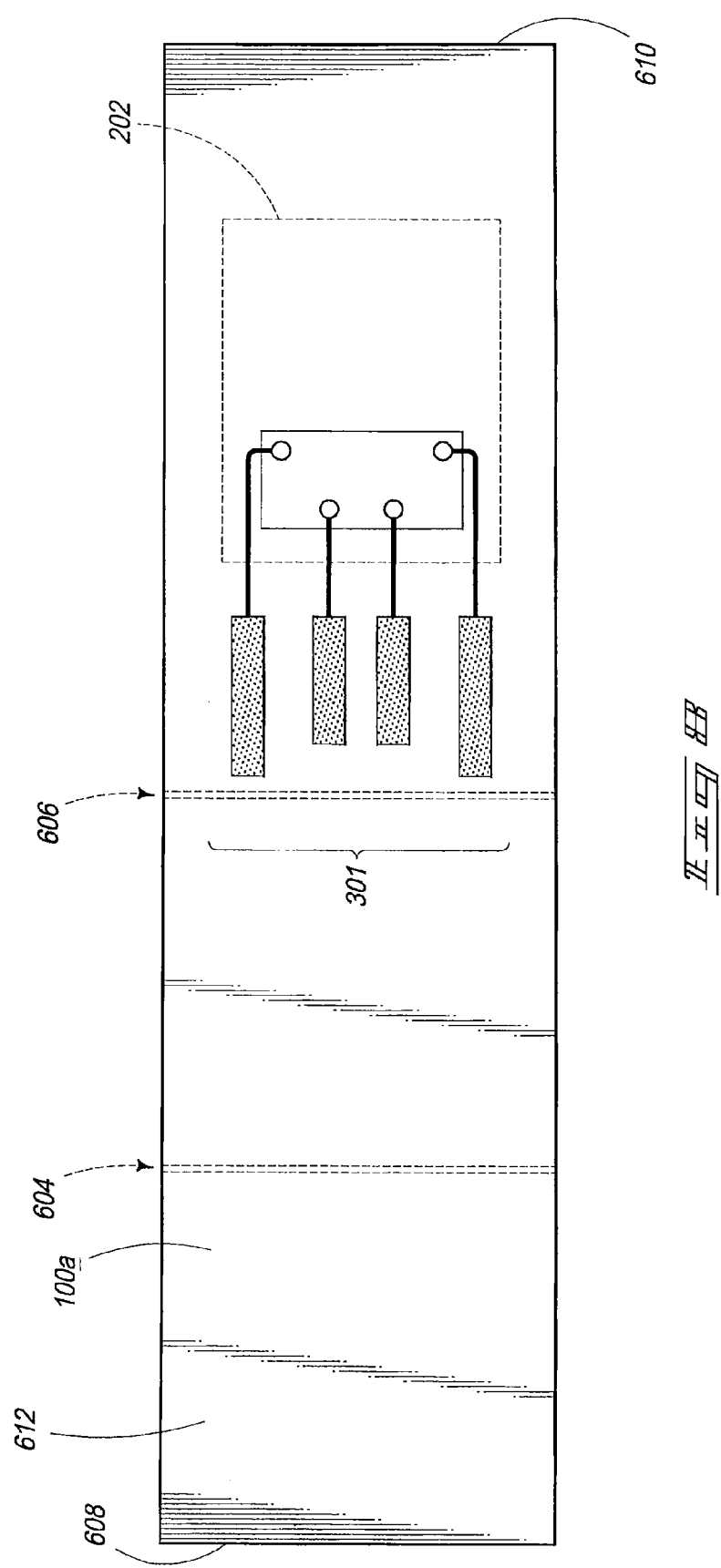
FIG. 8 is a top view of a data storage device according to an embodiment.
Figure 9:
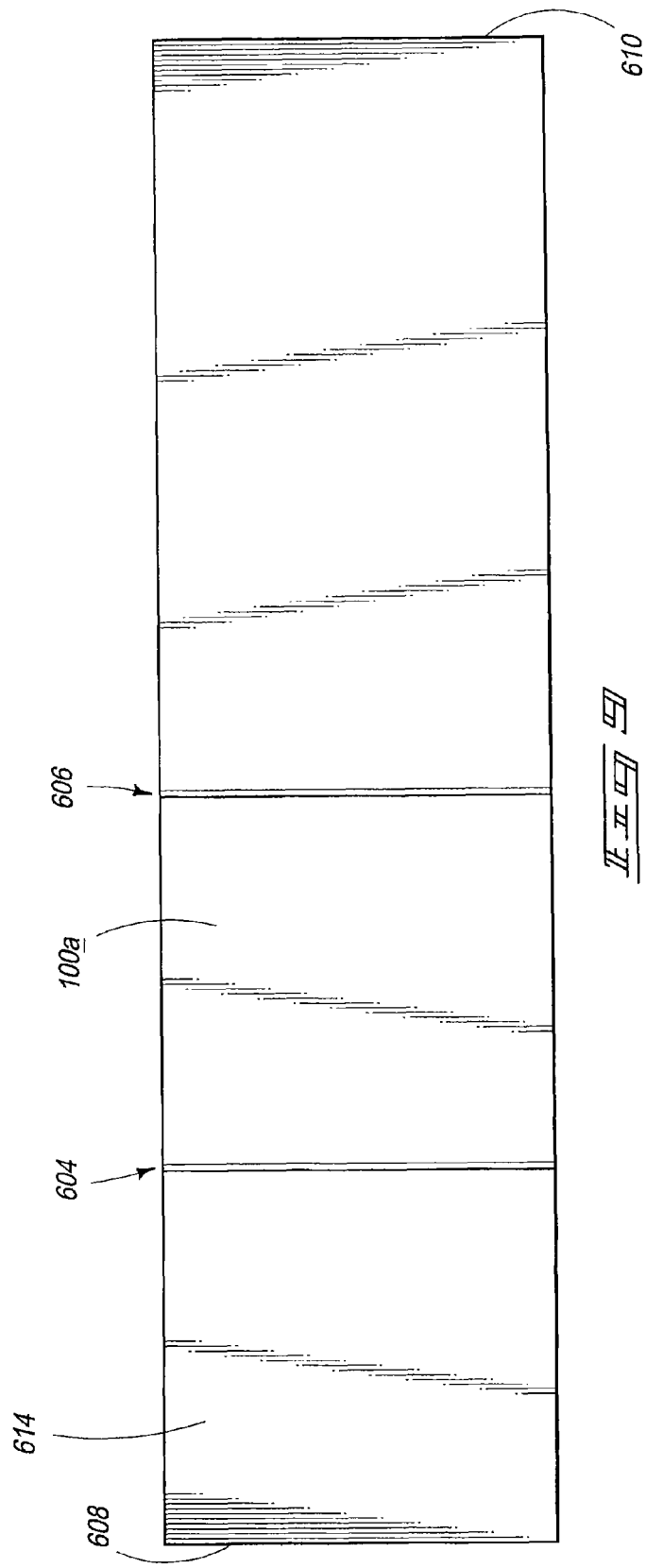
FIG. 9 is a bottom view of a data storage device according to an embodiment.
Figures 10, 10A, 10B:
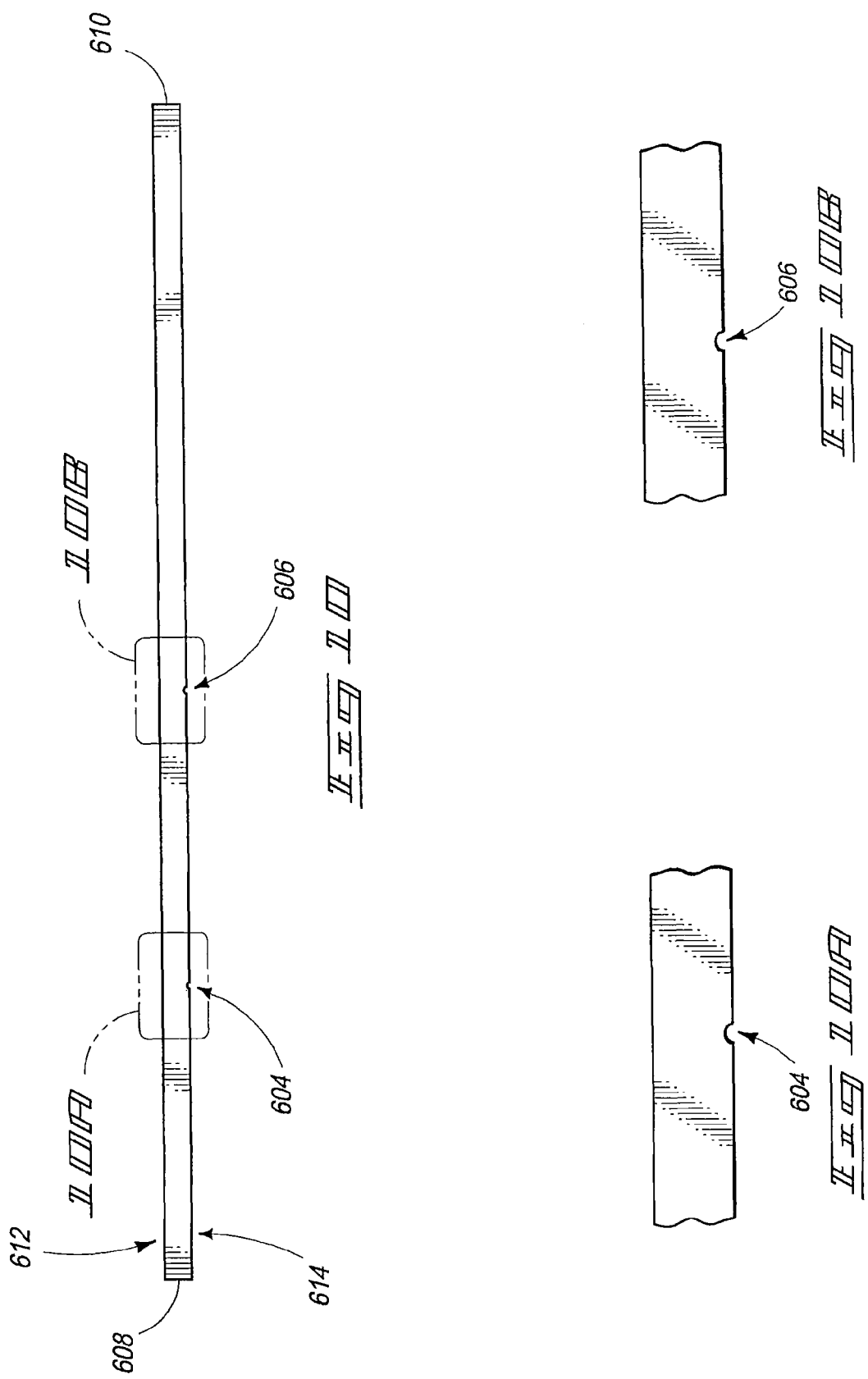
FIG. 10 is a side view of a data storage device according to an embodiment.
FIG. 10A is close-up view of a portion of a side view of a data storage device according to an embodiment.
FIG. 10B is close-up view of another portion of a side view of a data storage device according to an embodiment.

Referring to FIG. 8, a top view of data storage device 100a is illustrated. Referring to FIG. 9, a bottom view of data storage device 100a is illustrated. Referring to FIG. 10, a side view of data storage device 100a is illustrated. Referring to FIG. 10A, a close-up side view illustrating guide 604 of data storage device 100a is illustrated. Referring to FIG. 10B, a close-up side view illustrating guide 606 of data storage device 100a is illustrated.

Figure 11:
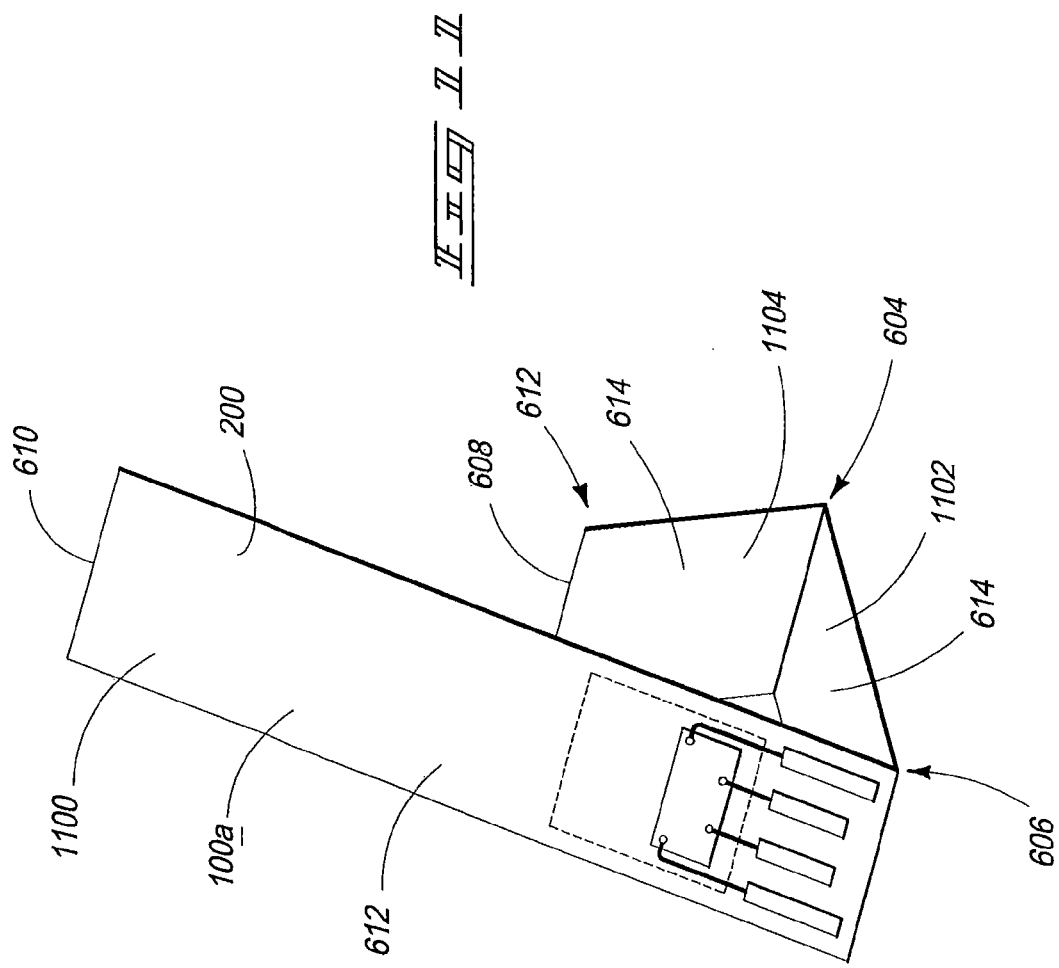
FIG. 11 is a perspective view of one embodiment of a data storage device in a partially folded state according to an embodiment.
Figure 11:
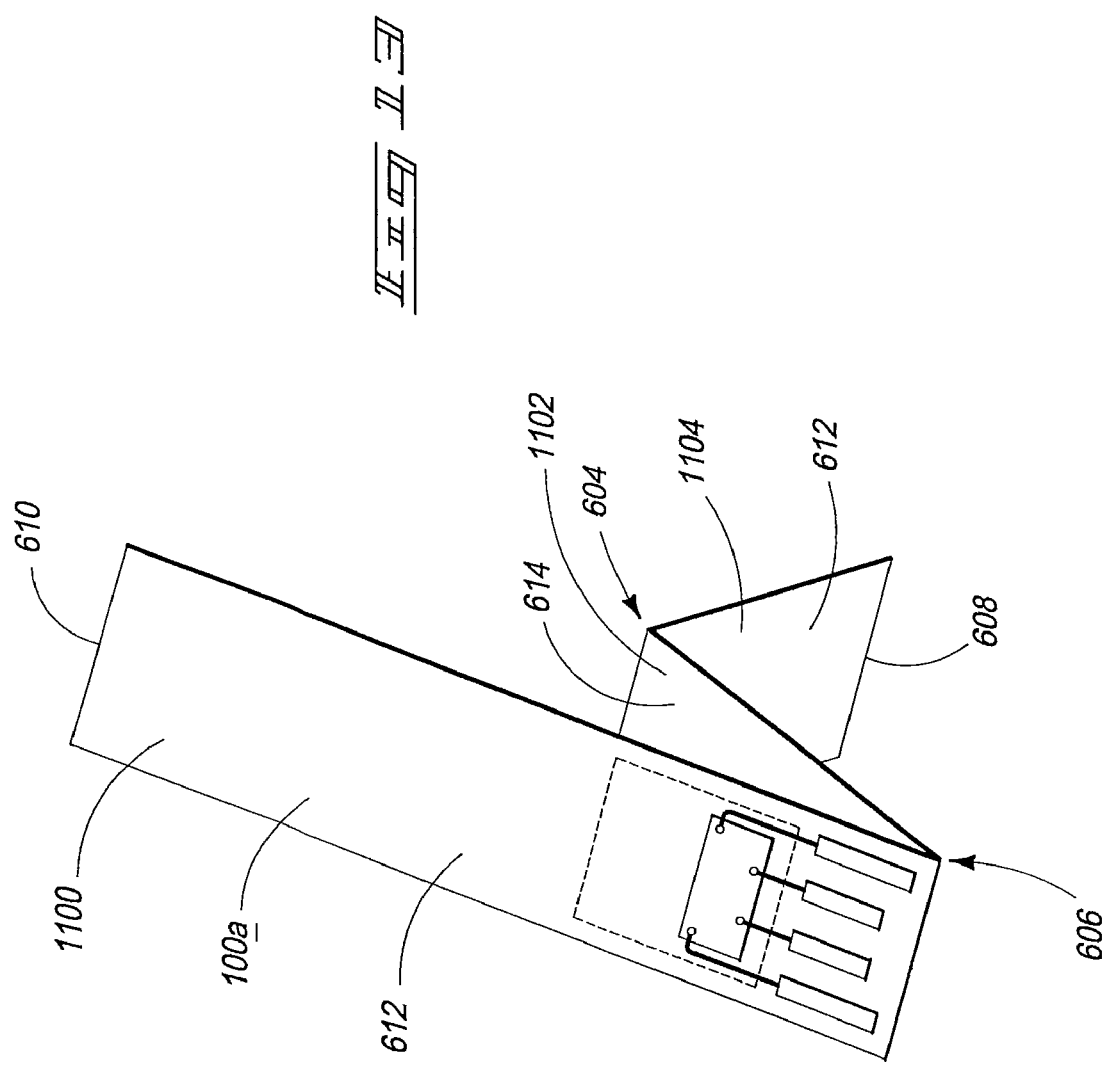

Referring to FIG. 11, a perspective view of data storage device 100a in a partially folded state is illustrated. In FIG. 11, a first portion 1100 of card 200 has been folded along guide 606 towards a second portion 1102 of card 200. Furthermore, a third portion 1104 of card 200 has been folded along guide 604 towards second portion 1102. The first portion extends from end 610 to guide 606, the second portion extends from guide 606 to guide 604, and the third portion extends from guide 604 to end 608. The two folds described above may be continued beyond the state illustrated in FIG. 11 to a fully folded state in which third portion 1104 physically contacts second portion 1102 and first portion 1100. As a result, first portion 1100, second portion 1102, and third portion 1104 may be parallel to one another; surface 614 of third portion 1104 may be in physical contact with surface 614 of second portion 1102; and surface 612 of third portion 1104 may be in physical contact with surface 614 of first portion 1100.

Referring to FIG. 11A, a side view of data storage device 100a in a fully folded state is illustrated. Note that portions 1100, 1102, and 1104 are parallel to one another. Small gaps between portions 1100, 1102, and 1104 are illustrated in FIG. 11A for clarity. In reality, the gaps might not be present. As a result, portion 1100 will be in direct physical contact with portion 1104 and portion 1102 will be in direct physical contact with portion 1104. In the fully folded state, the combination of portions 1100, 1102, and 1104 may have a desired thickness 1106. In one embodiment, thickness 1106 may be between about 1.8 mm and about 2.35 mm.

In one embodiment, one or more fasteners may be used to retain data storage device 100a in the fully folded state. For example, a first fastener may be used to attach surface 612 of portion 1104 to surface 614 of portion 1100. Furthermore, a second fastener may be used to attach surface 614 of portion 1104 to surface 614 of portion 1102.

In one embodiment, the fastener may comprise an adhesive that becomes sticky when moistened, such as is used in envelopes. In another embodiment, the fastener may comprise a sticky adhesive protected by a cover when data storage device 100a is in a substantially planar state prior to folding. During the process of putting data storage device 100a in the fully folded state depicted in FIG. 11A, the cover may be removed exposing the sticky adhesive.

In another embodiment, the fastener may comprise a clip such as a paper clip. The clip may be positioned so as to partially surround a cross section of portions 1100, 1102, and 1104 to retain portions 1100, 1102, and 1104 in the fully folded state. In another embodiment, the fastener may comprise a band, such as a resilient rubber band positioned around a cross section of portions 1100, 1102, and 1104 to retain portions 1100, 1102, and 1104 in the fully folded state.

Other fastening devices that retain portions of data storage device 100 in a fully folded state may alternatively or additionally be used.

Referring to FIG. 12, an end view of a standard electronic communications receptacle 1220 is illustrated. Receptacle 1220 may be a USB Series A receptacle. Receptacle 1220 includes a shell 1222 which surrounds an electrical interface 1224. Shell 1222 may be conductive. Shell 1222 includes retention devices 1228 and 1230. Electrical interface 1224 includes conductors 1226 which may be forced toward the top of receptacle 1220 when a plug is inserted into receptacle 1220. Dimension 1232 is a distance between interface 1224 and a surface of shell 1222. Dimension 1234 is a distance between conductors 1226 and retention devices 1230.

FIG. 12 also illustrates an end view of a standard electronic communications plug 1200. Plug 1200 includes electrical interface 1204 in which conductors 1206, 1208, 1210, and 1212 are embedded. Plug 1200 also includes a shell 1202 and a void 1214 between electrical interface 1204 and the top of shell 1202. Dimension 1216 is a distance between a top surface of electrical interface 1204 and a top surface of shell 1202. Dimension 1219 is a distance between the top surface of electrical interface 1204 and a bottom surface of shell 1202. Dimension 1218 is a width of plug 1200. Plug 1200 may be a USB Series A plug in which case dimension 1218 may be about 12 mm.

Plug 1200 may be inserted into receptacle 1220. As a result, electrical interface 1204 may make physical contact with conductors 1226 and may even deflect conductors 1226 upwards. A bottom surface of shell 1202 may make physical contact with retention devices 1230 and/or may make physical contact with shell 1222. A top portion of shell 1202 may be inserted between electrical interface 1224 and retention devices 1228. Furthermore, once plug 1200 is inserted into receptacle 1220, electrical interface 1204 may be electrically connected to electrical interface 1224. The position of shell 1202 within receptacle 1220 is illustrated in phantom.

When in the fully folded state, data storage device 100a may be inserted into receptacle 1220 between conductors 1226 and retention devices 1230. In order to fit within receptacle 1220, fully folded data storage device 100a may have a width less than or equal to width 1218 of plug 1200. The combined thickness 1106 of fully folded data storage device 100a may be greater than or equal to dimension 1234. If so, electrical interface 301 (located on portion 1100) may make physical and electrical contact with conductors 1226 and portion 1102 may make physical contact with retention devices 1230 and retention devices 1230 may securely retain fully folded data storage device 100a within receptacle 1220. Being securely retained within receptacle 1220 may ensure that data can be reliably read from storage circuitry 202 and/or reliably written to storage circuitry 202.

In some embodiments, combined thickness 1106 may be larger than dimension 1234 yet smaller than dimension 1232 so that fully folded data storage device 100a will fit within receptacle 1220. In some embodiments, combined thickness 1106 may be substantially the same as dimension 1219.

Additional details describing USB receptacles and plugs are available in the Universal Serial Bus Specification 3.0, released Nov. 12, 2008 and the Universal Serial Bus Specification 2.0, released Apr. 27, 2000, both of which are incorporated herein by reference and are available at www.usb.org.

Although data storage device 100a is depicted as having only three portions making up thickness 1106 in FIG. 11A, other embodiments of data storage device 100 are possible in which a fully folded data storage device has only one fold so that two portions make up thickness 1106. In these embodiments, a thickness of card 200 may be selected so that the combined thickness of the two portions is substantially equal to combined thickness 1106. Furthermore, other embodiments of data storage device 100 are possible in which a fully folded data storage device has more than two folds so that three or more portions make up thickness 1106. In these embodiments, a thickness of card 200 may be selected so that the combined thickness of the three or more portions is substantially equal to combined thickness 1106.

Of course, data storage devices 100 may be sized to fit into standard electrical communications receptacles other than USB receptacles.

Referring to FIG. 13, a perspective view of data storage device 100a in a partially folded state is illustrated. In FIG. 13, the depicted folding configuration is different than the folding configuration of FIG. 11. In FIG. 13, a first portion 1100 of card 200 has been folded along guide 606 towards a second portion 1102 of card 200. Furthermore, a third portion 1104 of card 200 has been folded along guide 604 towards second portion 1102.

The two folds described above may be continued beyond the state illustrated in FIG. 13 to a fully folded state in which third portion 1104 physically contacts second portion 1102, but not first portion 1100, and second portion 1102 physically contacts first portion 1100. As a result, first portion 1100, second portion 1102, and third portion 1104 may be parallel to one another; surface 612 of third portion 1104 may be in physical contact with surface 612 of second portion 1102; and surface 614 of second portion 1102 may be in physical contact with surface 614 of first portion 1100. When in this fully folded state, the combined thickness of portions 1100, 1102, and 1104 may be substantially the same as combined thickness 1106. In one embodiment, portion 1100 may be attached to portion 1102 and portion 1102 may be attached to portion 1104 via one or more fasteners.

Referring to FIG. 14, a top view of one embodiment 100c of data storage device 100 is illustrated. Note that data storage device 100c is substantially planar and comprises a first end 1402, a second end 1404, an upper surface 1418, and a lower surface 1420 (not visible in FIG. 14). Data storage device 100c also include two guides 1406 and 1408. Guide 1406 may indicate a location where a first fold of data storage device 100c may be made and guide 1408 may indicate a location where a second fold of data storage device 100c may be made.

Referring to FIG. 14A, a perspective view of data storage device 100c in a partially folded state is illustrated. In FIG. 14A, a first portion 1410 of card 200c has been folded along guide 1406 towards a second portion 1412 of card 200c. Furthermore, a third portion 1416 of card 200c has been folded along guide 1408 towards second portion 1412. First portion 1410 extends from end 1402 to guide 1406, second portion 1412 extends from guide 1406 to guide 1408, and third portion 1416 extends from guide 1408 to end 1404.

The two folds described above may be continued beyond the state illustrated in FIG. 14A to a fully folded state in which third portion 1416 physically contacts second portion 1412, but not first portion 1410, and second portion 1412 physically contacts first portion 1410. As a result, first portion 1410, second portion 1412, and third portion 1416 may be parallel to one another; surface 1418 of third portion 1416 may be in physical contact with surface 1418 of second portion 1412; and surface 1420 of second portion 1412 may be in physical contact with surface 1420 of first portion 1410. When in this fully folded state, the combined thickness of portions 1410, 1412, and 1416 may be substantially the same as combined thickness 1106. In one embodiment, portion 1410 may be attached to portion 1412 and portion 1412 may be attached to portion 1416 via one or more fasteners.

Figure 15:
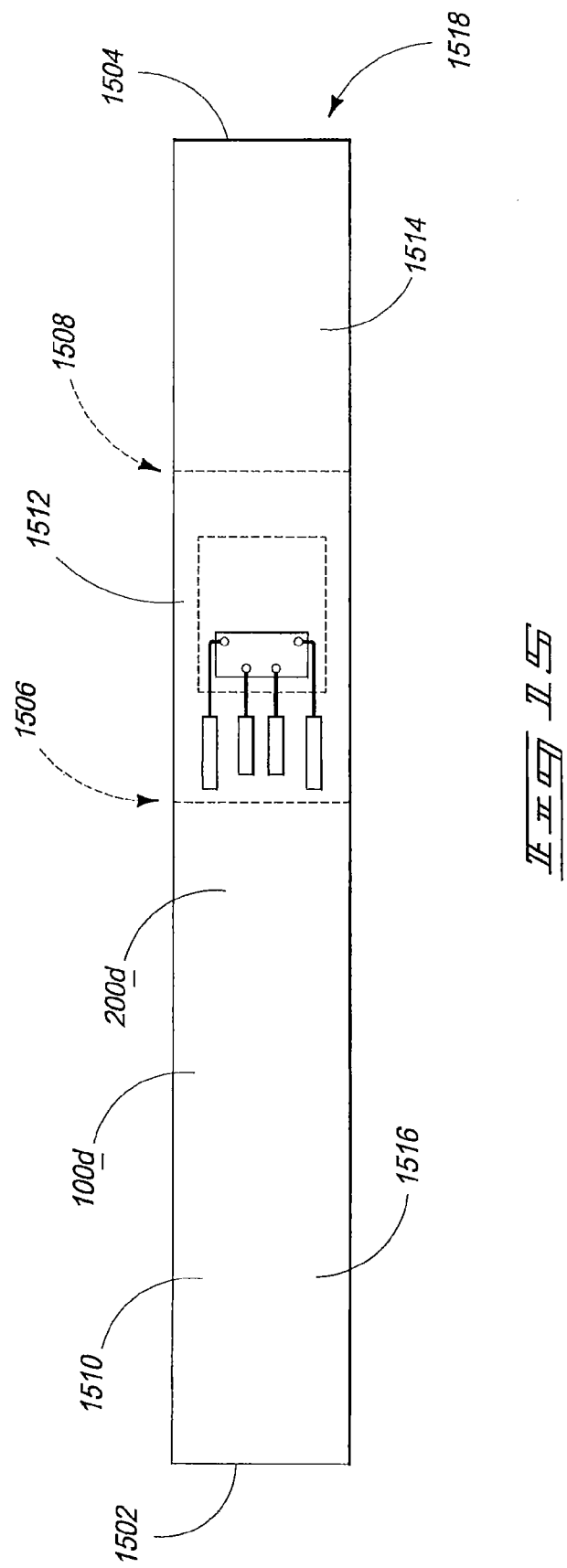
FIG. 15 is a top view of another embodiment of a data storage device.

Referring to FIG. 15, a top view of one embodiment 100d of data storage device 100 is illustrated. Note that data storage device 100d is substantially planar and comprises a first end 1502, a second end 1504, an upper surface 1516, and a lower surface 1518 (not visible in FIG. 15). Data storage device 100d also include two guides 1506 and 1508. Guide 1506 may indicate a location where a first fold of data storage device 100*d* may be made and guide 1508 may indicate a location where a second fold of data storage device 100*d* may be made.

Referring to FIG. 15A, a perspective view of data storage device 100*d* in a partially folded state is illustrated. In FIG. 15A, a first portion 1510 of card 200*d* has been folded along guide 1506 towards a second portion 1512 of card 200*d*. Furthermore, a third portion 1514 of card 200*d* has been folded along guide 1508 towards second portion 1512. First portion 1510 extends from end 1502 to guide 1506, second portion 1512 extends from guide 1506 to guide 1508, and third portion 1514 extends from guide 1508 to end 1504.

The two folds described above may be continued beyond the state illustrated in FIG. 15A to a fully folded state in which third portion 1514 physically contacts second portion 1512 and first portion 1510, and second portion 1512 physically contacts second portion 1514. As a result, first portion 1510, second portion 1512, and third portion 1514 may be parallel to one another; surface 1518 of third portion 1514 may be in physical contact with surface 1518 of second portion 1512; and surface 1516 of third portion 1514 may be in physical contact with surface 1518 of first portion 1510. When in this fully folded state, the combined thickness of portions 1510, 1512, and 1514 may be substantially the same as combined thickness 1106. In one embodiment, portion 1514 may be attached to portion 1512 and portion 1514 may be attached to portion 1510 via one or more fasteners.

Referring to FIG. 16, a top view of one embodiment 100*e* of data storage device 100 is illustrated. Note that data storage device 100*e* is substantially planar and comprises a first end 1616, a second end 1618, an upper surface 1612, and a lower surface 1614 (not visible in FIG. 16). Data storage device 100*e* also include two guides 1602 and 1604. Guide 1602 may indicate a location where a first fold of data storage device 100*e* may be made and guide 1604 may indicate a location where a second fold of data storage device 100*e* may be made.

Figure 16A:
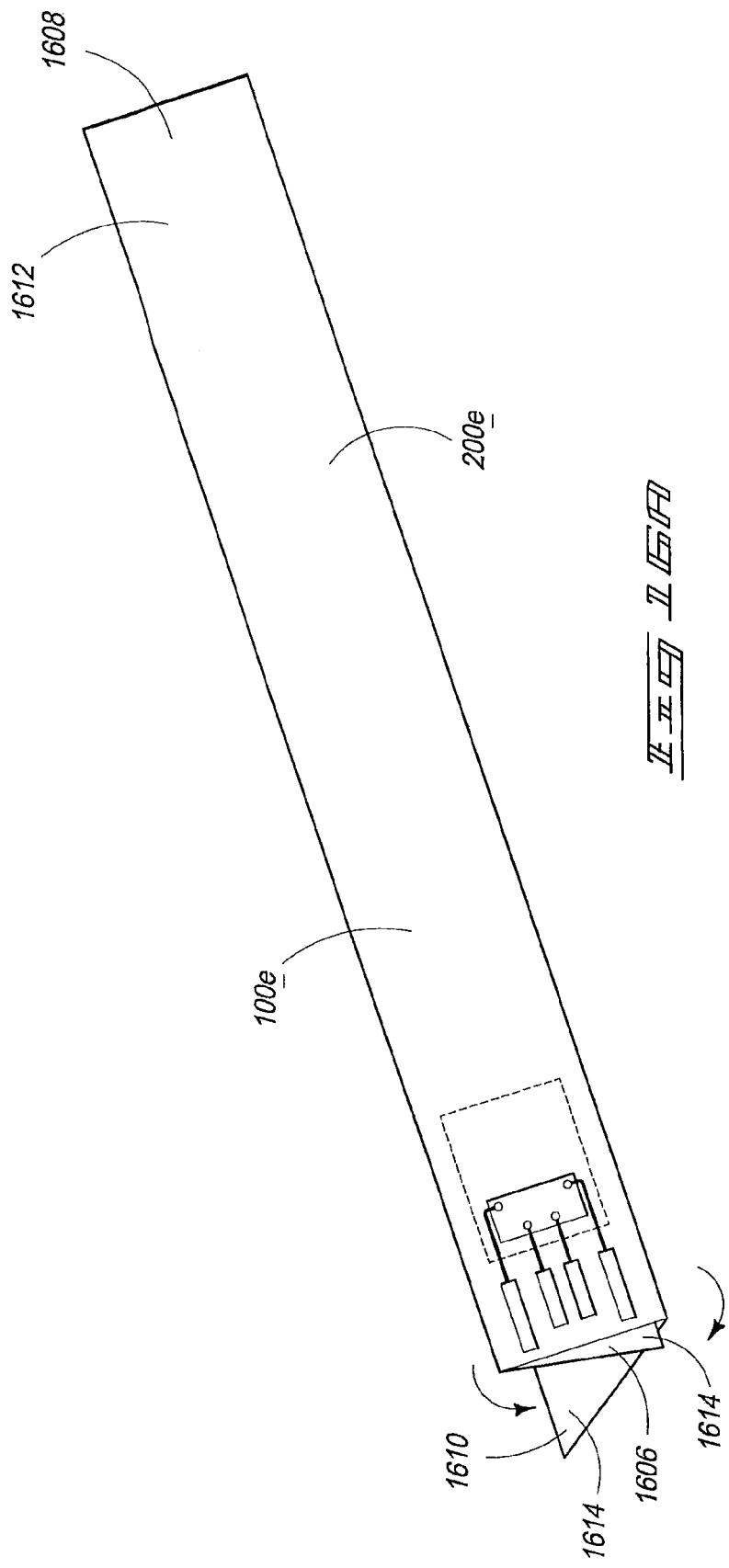
FIG. 16A is a perspective view of another embodiment of a data storage device in a partially folded state according to an embodiment.

Referring to FIG. 16A, a perspective view of data storage device 100*e* in a partially folded state is illustrated. In FIG. 16A, a first portion 1606 of card 200*e* has been folded along guide 1602 towards a second portion 1608 of card 200*e*. Furthermore, a third portion 1610 of card 200*e* has been folded along guide 1604 towards second portion 1608 and third portion 1610. First portion 1606 extends from end 1616 to guide 1602, second portion 1608 extends from guide 1602 to guide 1604, and third portion 1610 extends from guide 1604 to end 1618.

The two folds described above may be continued beyond the state illustrated in FIG. 16A to a fully folded state in which first portion 1606 physically contacts second portion 1608 and third portion 1610, and third portion 1610 physically contacts first portion 1606. As a result, first portion 1606, second portion 1608, and third portion 1610 may be parallel to one another; surface 1614 of first portion 1606 may be in physical contact with surface 1614 of second portion 1608; and surface 1612 of first portion 1606 may be in physical contact with surface 1614 of third portion 1610. When in this fully folded state, the combined thickness of portions 1606, 1608, and 1610 may be substantially the same as combined thickness 1106. In one embodiment, portion 1606 may be attached to portion 1608 and portion 1610 may be attached to portion 1606 via one or more fasteners.

Storage circuitry 202 of data storage device 100 may be programmed when data storage device 100 is substantially planar using a programmer designed to make contact with electrical interface 301 even though a thickness of data storage device 100 when in the substantially planar state is less than the thickness of a standard USB Series A plug. Furthermore, the programmer may be designed to make contact with electrical interface 301 even if electrical interface 301 is not near an edge of data storage device 100 or an edge of a sheet comprising a plurality of carriers 102 and data storage devices 100.

According to one aspect of the invention, a data storage device includes storage circuitry (e.g., storage circuitry 202) configured to store data and a substantially planar card (e.g., card 200). The card may comprise paper card stock and may be substantially rectangular. The substantially planar card includes a first portion, one or more additional portions, a guide marking a boundary between the first portion and at least one of the one or more additional portions, and the storage circuitry. In one embodiment, the first portion and the one or more additional portions may all have substantially the same thickness. The guide may extend along a longest dimension of the card (e.g., guides 1602 and 1604 of FIG. 16). Alternatively or additionally, the guide may extend along a second longest dimension of the card (e.g., guides 604 and 606 of FIG. 6).

The data storage device also includes an electrical interface electrically connected to the storage circuitry and located on a first face of the first portion of the card. The card is configured so that if the first portion is folded along the guide with respect to the at least one of the one or more additional portions so that the one or more portions are directly below the electrical interface, and the first portion and the one or more additional portions are parallel to each other, the combined thickness of the first portion and the one or more additional portions is sufficient to make contact with both an electrical interface of a standard communications receptacle and a shell portion of the receptacle when the folded card is inserted into the standard electrical communications receptacle. The standard electrical communications receptacle may be a USB Series A receptacle. In one embodiment, the combined thickness may be at least 1.7 mm and/or may be between about 1.7 mm and 2.35 mm.

According to another aspect of the invention, a data storage device includes storage circuitry configured to store data and a substantially planar card. The substantially planar card includes a first portion, one or more additional portions, a guide marking a boundary between the first portion and at least one of the one or more additional portions, and the storage circuitry. The guide may be one of a perforation, a printed line, a groove, or a crease.

The card may include a first layer and a second layer laminated together and the storage circuitry comprises electronics printed on at least one of the first layer and the second layer using electrically functional ink. Alternatively, The card may include a first layer, a second layer, and a third layer laminated together, each layer comprising paper and the storage circuitry comprises a semiconductor chip positioned between the first layer and the third layer and within a window cut out of the second layer.

The data storage device also includes an electrical interface electrically connected to the storage circuitry and located on a first face of the first portion of the card. The card is configured so that if the first portion is folded along the guide with respect to the at least one of the one or more additional portions so that the one or more portions are directly below the electrical interface, and the first portion and the one or more additional portions are parallel to each other, the combined thickness of the first portion and the one or more additional portions is substantially the same as a thickness of a plug portion of a standard electrical communications plug.

The standard electrical communications plug may be a USB Series A plug and the plug portion may be sized to make contact with both an electrical interface portion of a USB Series A receptacle and a shell portion of the receptacle when the plug portion is inserted into the receptacle.

In one embodiment, the data storage device may be attached to a substantially planar carrier comprising paper using a fastener configured to allow the data storage device to be detached from the carrier without damaging the data storage device.

According to another aspect of the invention, a data storage device includes storage circuitry configured to store data; a first substantially planar card portion comprising the storage circuitry; an electrical interface electrically connected to the storage circuitry and located on one side of the first card portion; and one or more additional substantially planar card portions positioned below the other side of the first card portion and positioned parallel to one another and parallel to the first card portion. The storage circuitry may include a semiconductor chip. The combined thickness of the first card portion and the one or more additional card portions is sufficient to make contact with both an electrical interface of an electrical communications receptacle and a shell portion of the receptacle when the first card portion and the one or more additional card portions are inserted into the communications receptacle.

The device may further include at least one fastening device keeping the first portion in physical contact with at least one of the one or more additional portions and keeping the first portion and the one or more additional portions in parallel with one another. The fastening device may be one of an adhesive, a staple, or a clip.

In one embodiment, the electrical interface may include conductive ink and the interface may be configured to allow the data to be read from the storage circuitry.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A data storage device comprising:
   storage circuitry configured to store data;
   a substantially planar card comprising a first portion, one or more additional portions, a guide marking a boundary between the first portion and at least one of the one or more additional portions, and the storage circuitry;
   an electrical interface electrically connected to the storage circuitry and located on a first face of the first portion of the card; and
   wherein the card is configured so that if the first portion is folded along the guide with respect to the at least one of the one or more additional portions so that the one or more portions are directly below the electrical interface, and the first portion and the one or more additional portions are parallel to each other, the combined thickness of the first portion and the one or more additional portions is sufficient to make contact with both an electrical interface of a standard communications receptacle and a shell portion of the receptacle when the folded card is inserted into the standard electrical communications receptacle.

2. The device of claim 1 wherein the standard electrical communications receptacle is a USB Series A receptacle.

3. The device of claim 1 wherein the combined thickness is between about 1.8 mm and 2.35 mm.

4. The device of claim 1 wherein the combined thickness is at least 1.7 mm.

5. The device of claim 1 wherein the card comprises paper card stock and is substantially rectangular.

6. The device of claim 1 wherein the first portion and the one or more additional portions all have substantially the same thickness.

7. The device of claim 1 wherein the guide extends along a longest dimension of the card.

8. The device of claim 1 wherein the guide extends along a second longest dimension of the card.

9. A data storage device comprising:
   storage circuitry configured to store data;
   a substantially planar card comprising a first portion, one or more additional portions, a guide marking a boundary between the first portion and at least one of the one or more additional portions, and the storage circuitry;
   an electrical interface electrically connected to the storage circuitry and located on a first face of the first portion of the card; and
   wherein the card is configured so that if the first portion is folded along the guide with respect to the at least one of the one or more additional portions so that the one or more portions are directly below the electrical interface, and the first portion and the one or more additional portions are parallel to each other, the combined thickness of the first portion and the one or more additional portions is substantially the same as a thickness of a plug portion of a standard electrical communications plug.

10. The device of claim 9 wherein the standard electrical communications plug is a USB Series A plug and the plug portion is sized to make contact with both an electrical interface portion of a USB Series A receptacle and a shell portion of the receptacle when the plug portion is inserted into the receptacle.

11. The device of claim 9 wherein the guide comprises one of a perforation, a printed line, a groove, or a crease.

12. The device of claim 9 wherein the data storage device is attached to a substantially planar carrier comprising paper using a fastener configured to allow the data storage device to be detached from the carrier without damaging the data storage device.

13. The device of claim 9 wherein the card comprises a first layer and a second layer laminated together and the storage circuitry comprises electronics printed on at least one of the first layer and the second layer using electrically functional ink.

14. The device of claim 9 wherein the card comprises a first layer, a second layer, and a third layer laminated together, each layer comprising paper and the storage circuitry comprises a semiconductor chip positioned between the first layer and the third layer and within a window cut out of the second layer.

15. A data storage device comprising:
   storage circuitry configured to store data;
   a first substantially planar card portion comprising the storage circuitry;
   an electrical interface electrically connected to the storage circuitry and located on one side of the first card portion;
   one or more additional substantially planar card portions positioned below the other side of the first card portion and positioned parallel to one another and parallel to the first card portion;

wherein the combined thickness of the first card portion and the one or more additional card portions is sufficient to make contact with both an electrical interface of an electrical communications receptacle and a shell portion of the receptacle when the first card portion and the one or more additional card portions are inserted into the communications receptacle.

16. The device of claim 15 further comprising at least one fastening device keeping the first portion in physical contact with at least one of the one or more additional portions and keeping the first portion and the one or more additional portions in parallel with one another.

17. The device of claim 15 wherein the fastening device comprises one of an adhesive, a staple, or a clip.

18. The device of claim 15 wherein the electrical interface comprises conductive ink.

19. The device of claim 15 wherein the interface is configured to allow the data to be read from the storage circuitry.

20. The device of claim 15 wherein the storage circuitry comprises a semiconductor chip.

* * * * *

UNITED STATES PATENT AND TRADEMARK OFFICE
CERTIFICATE OF CORRECTION

| | |
|---|---|
| PATENT NO. | : 8,047,443 B2 |
| APPLICATION NO. | : 12/604300 |
| DATED | : November 1, 2011 |
| INVENTOR(S) | : Andrew C. DePaula |

Page 1 of 1

It is certified that error appears in the above-identified patent and that said Letters Patent is hereby corrected as shown below:

On the Title Page, Item (56) References Cited – Insert --7,537,169 B2 5/2009 Gonzalez et al.--

Column 2, line 17 – Replace "as a of a" with --as a width of a--

Signed and Sealed this
Twenty-fourth Day of July, 2012

David J. Kappos
*Director of the United States Patent and Trademark Office*